US012803276B2

(12) United States Patent
Ikeda

(10) Patent No.: US 12,803,276 B2
(45) Date of Patent: Nov. 17, 2026

(54) CIRCUIT DEVICE

(71) Applicant: SEIKO EPSON CORPORATION, Tokyo (JP)

(72) Inventor: Masuhide Ikeda, Matsumoto (JP)

(73) Assignee: SEIKO EPSON CORPORATION (JP)

( * ) Notice: Subject to any disclaimer, the term of this patent is extended or adjusted under 35 U.S.C. 154(b) by 161 days.

(21) Appl. No.: 18/923,810

(22) Filed: Oct. 23, 2024

(65) Prior Publication Data

US 2025/0132559 A1 Apr. 24, 2025

(30) Foreign Application Priority Data

Oct. 24, 2023 (JP) ................................ 2023-182374

(51) Int. Cl.

| | |
|---|---|
| ***H02H 9/00*** | (2006.01) |
| ***H02H 9/04*** | (2006.01) |
| ***H02M 1/08*** | (2006.01) |
| ***H02M 1/32*** | (2007.01) |
| ***H02M 3/158*** | (2006.01) |
| ***H10D 18/00*** | (2025.01) |
| ***H10D 89/60*** | (2025.01) |

(52) U.S. Cl.

CPC .............. *H02H 9/046* (2013.01); *H02M 1/08* (2013.01); *H02M 1/32* (2013.01); *H02M 3/158* (2013.01); *H10D 18/251* (2025.01); *H10D 89/60* (2025.01)

(58) Field of Classification Search

CPC ...................................................... H02H 9/046

See application file for complete search history.

(56) References Cited

U.S. PATENT DOCUMENTS 12,567,739 B2 * 3/2026 Ikeda ...................... H02H 9/046
2002/0101273 A1 * 8/2002 Morishita ............... H03F 1/523 327/310
2008/0252634 A1 * 10/2008 Sato ................. H03K 19/00315 326/80
2008/0253045 A1 * 10/2008 Sato ..................... H10D 89/601 361/56
2015/0234411 A1 8/2015 Moriya
2023/0418319 A1 * 12/2023 Potera .................... G01R 31/50

FOREIGN PATENT DOCUMENTS

JP 2015-153937 A 8/2015

* cited by examiner

*Primary Examiner* — Stephen W Jackson

(74) *Attorney, Agent, or Firm* — Harness, Dickey & Pierce, P.L.C.

(57) ABSTRACT

A circuit device includes a first low-potential-side power source terminal, a second low-potential-side power source terminal, a drive circuit, a switching control circuit, and a bidirectional thyristor for electrostatic protection. The drive circuit is coupled to the first low-potential-side power source terminal and drives a drive target with a switching operation. The switching control circuit is coupled to the second low-potential-side power source terminal and controls the switching operation of the drive circuit. One end of the bidirectional thyristor is coupled to the first low-potential-side power source terminal and another end of the bidirectional thyristor is coupled to the second low-potential-side power source terminal.

12 Claims, 27 Drawing Sheets

CIRCUIT DEVICE

The present application is based on, and claims priority from JP Application Serial Number 2023-182374, filed Oct. 24, 2023, the disclosure of which is hereby incorporated by reference herein in its entirety.

BACKGROUND

1. Technical Field

The present disclosure relates to a circuit device or the like.

2. Related Art

There is known a circuit device that drives a drive target such as a DC motor or a linear solenoid. Disclosed in JP-A-2015-153937 is a circuit device including a bridge circuit that drives a motor, a detection circuit that detects a current flowing through the bridge circuit based on a voltage at one end of a sense resistor, and a control circuit that controls the bridge circuit based on the result of detection performed by the detection circuit.

Since a large current flows through a drive circuit that drives the drive target, a potential change caused by the current may influence the control of the drive circuit. In JP-A-2015-153937 described above, the drive circuit is the bridge circuit, and a potential change caused by a current flowing through the bridge circuit may influence the operation of the detection circuit and thus the bridge circuit may be erroneously controlled.

SUMMARY

According to an aspect of the present disclosure, there is provided a circuit device including a first low-potential-side power source terminal, a second low-potential-side power source terminal, a drive circuit that is coupled to the first low-potential-side power source terminal and that drives a drive target with a switching operation, a switching control circuit that is coupled to the second low-potential-side power source terminal and that controls the switching operation of the drive circuit, and a bidirectional thyristor for electrostatic protection of which one end is coupled to the first low-potential-side power source terminal and of which another end is coupled to the second low-potential-side power source terminal.

According to another aspect of the present disclosure, there is provided a circuit device including a first high-potential-side power source terminal, a second high-potential-side power source terminal, a drive circuit that is coupled to the first high-potential-side power source terminal and that drives a drive target with a switching operation, a switching control circuit that is coupled to the second high-potential-side power source terminal and that controls the switching operation of the drive circuit, and a bidirectional thyristor of which one end is coupled to the first high-potential-side power source terminal and of which another end is coupled to the second high-potential-side power source terminal.

DESCRIPTION OF EMBODIMENTS

Hereinafter, a preferred embodiment of the present disclosure will be described in detail. The present embodiment described below does not unreasonably limit contents described in the claims, and all of components described in the present embodiment may not be essential constituent requirements.

1. Motor Driver

A circuit device of the present embodiment can be applied to, for example, a motor driver, a switching regulator, or a solenoid driver. That is, the circuit device can drive, for example, a motor, a coil, or a solenoid as a drive target. Hereinafter, an example in which the circuit device of the present embodiment is applied to a motor driver will be described.

Figure 1:
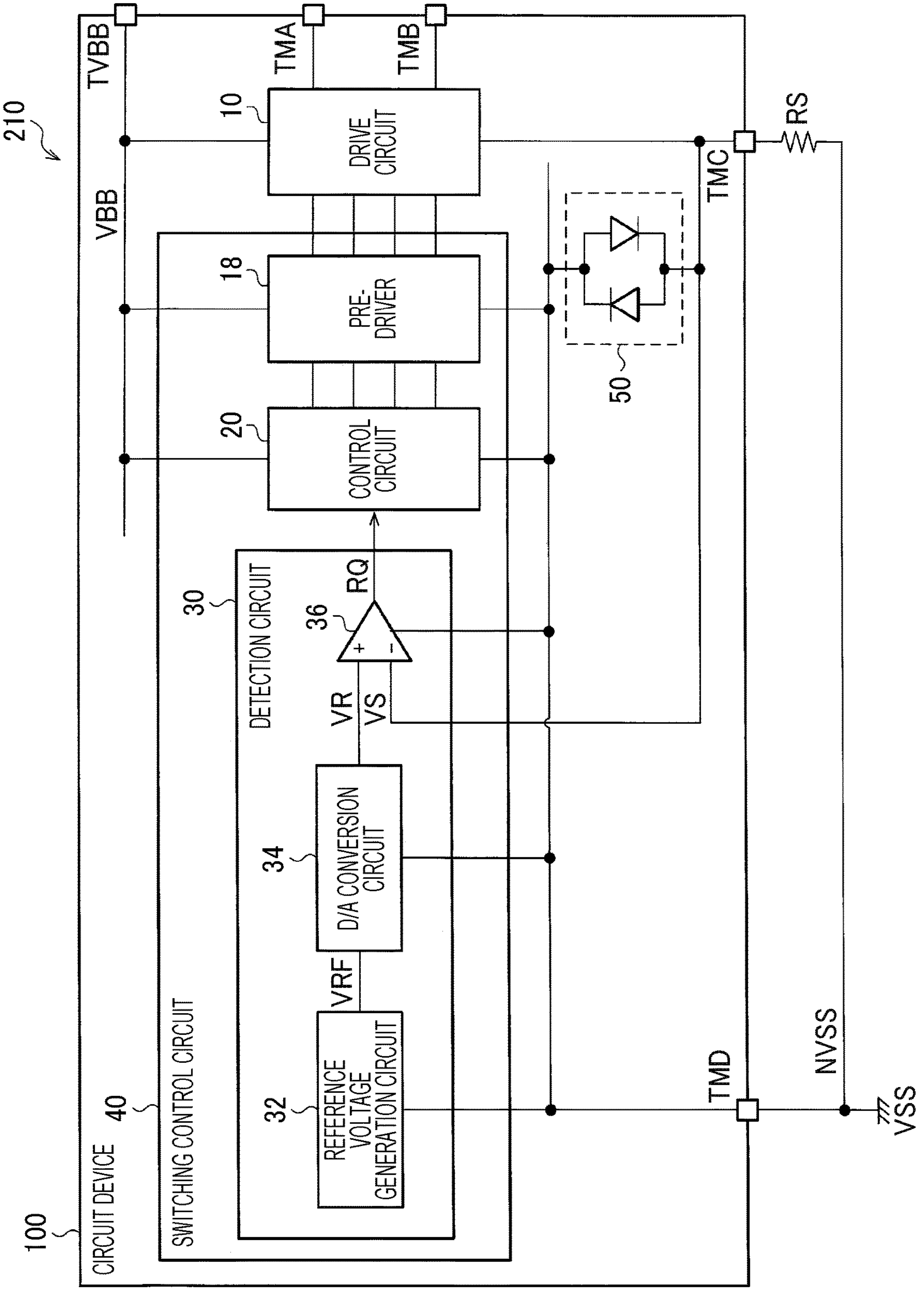
FIG. 1 shows a configuration example of a motor driver and a configuration example of a circuit device with a bidirectional diode used as an electrostatic protection circuit.

FIG. 1 shows a configuration example of a motor driver and a configuration example of a circuit device with a bidirectional diode used as an electrostatic protection circuit. A motor driver 210 includes a circuit device 100 and a sense resistor RS. The circuit device 100 includes a drive circuit 10, a switching control circuit 40, a bidirectional diode 50, a first low-potential-side power source terminal TMC, a second low-potential-side power source terminal TMD, a first high-potential-side power source terminal TVBB, a first drive terminal TMA, and a second drive terminal TMB.

A power source voltage VBB is supplied from a power source to the first high-potential-side power source terminal TVBB. The second low-potential-side power source terminal TMD is coupled to a ground node NVSS. A ground voltage VSS is supplied from a power source to the ground node NVSS. The first low-potential-side power source terminal TMC is coupled to one end of the sense resistor RS. Another end of the sense resistor RS is coupled to the ground node NVSS. Note that the voltage VBB may be referred to as a high-potential-side power source voltage, and the voltage VSS may be referred to as a low-potential-side power source voltage. The voltage VSS is not limited to a ground voltage as long as the voltage VSS is a constant voltage lower than the voltage VBB. The first drive terminal TMA is coupled to one end of a motor. The second drive terminal TMB is coupled to another end of the motor.

The circuit device 100 is, for example, an integrated circuit device in which a plurality of circuit elements are integrated on a semiconductor substrate. Each of the above-described terminals is, for example, a pad provided on the semiconductor substrate or a terminal of a package that accommodates the semiconductor substrate.

The switching control circuit 40 controls a switching operation of the drive circuit 10 based on a voltage VS at the one end of the sense resistor RS. The switching control circuit 40 includes a detection circuit 30, a control circuit 20, and a pre-driver 18.

The detection circuit 30 detects, based on the voltage VS at the one end of the sense resistor RS, a current flowing through the motor driven by the drive circuit 10. Specifically, the detection circuit 30 includes a reference voltage generation circuit 32, a D/A conversion circuit 34, and a comparison circuit 36.

The reference voltage generation circuit 32 generates a plurality of voltages VRF. The reference voltage generation circuit 32 includes, for example, a bandgap reference circuit and a voltage dividing circuit that generates the plurality of voltages VRF based on an output voltage of the bandgap reference circuit. The D/A conversion circuit 34 selects one voltage from among the plurality of voltages VRF and outputs the selected voltage as a reference voltage VR. The D/A conversion circuit 34 is, for example, a switch circuit composed of a transistor. The comparison circuit 36 compares the reference voltage VR with the voltage VS, and outputs the result of the comparison as a detection result signal RQ. In an example shown in FIG. 1, the signal RQ is at a high level when $VS<VR$, and the signal RQ is at a low level when $VS>VR$.

The control circuit 20 outputs, based on the detection result signal RQ, a control signal to control each transistor of the drive circuit 10 to be turned on or off. The pre-driver 18 outputs a pre-drive signal that drives a gate of each transistor of the drive circuit 10 by buffering the control signal from the control circuit 20. The high-potential-side power source voltage at the control circuit 20 and the pre-driver 18 is the voltage VBB.

Figure 2:
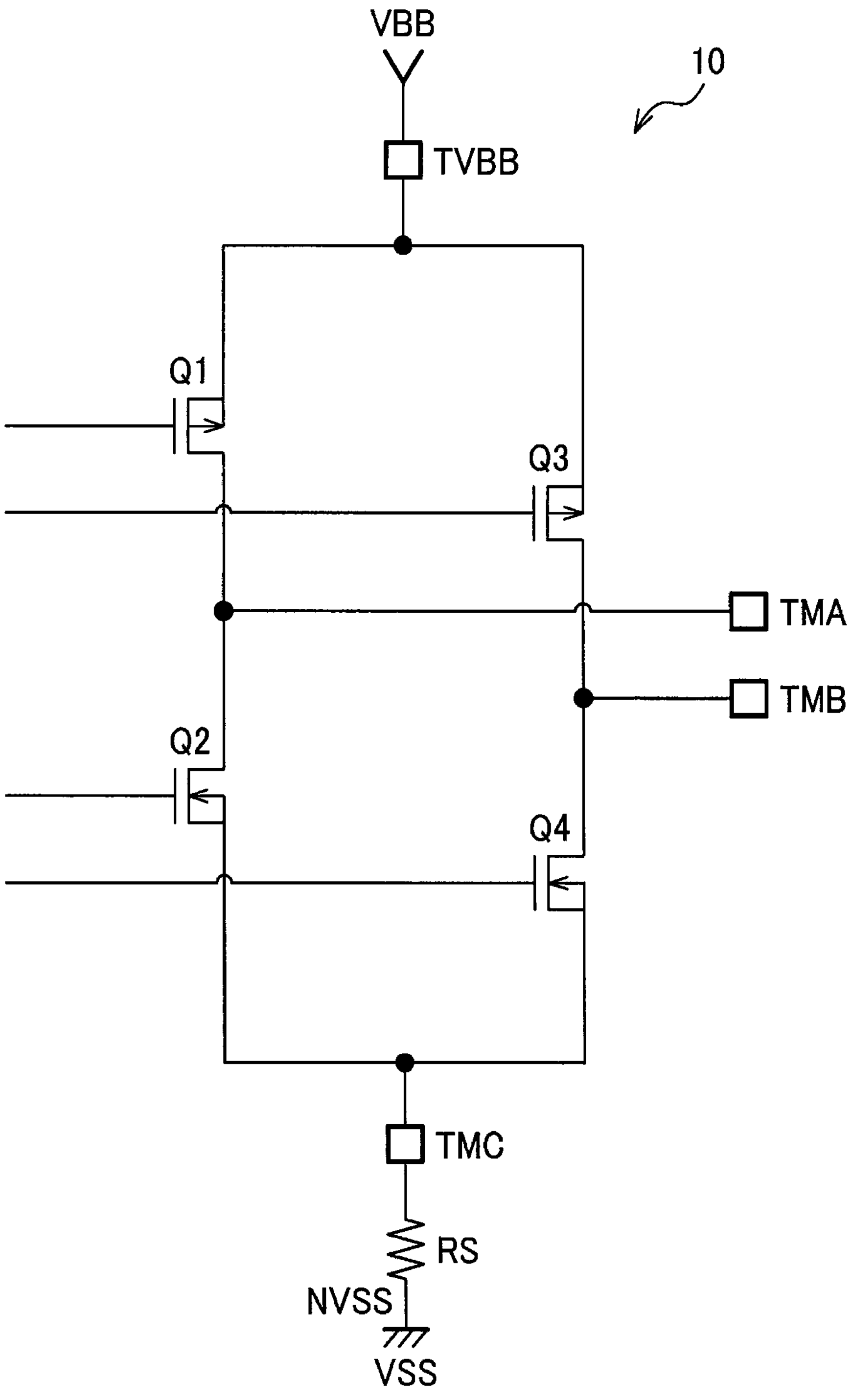
FIG. 2 shows a detailed configuration example of a drive circuit.

The drive circuit 10 drives the motor based on the pre-drive signal. FIG. 2 is a detailed configuration example of the drive circuit. The drive circuit 10 is a bridge circuit and includes transistors Q1 to Q4.

The transistors Q1 and Q3 are P-type MOS transistors. A source of the transistor Q1 is coupled to the first high-potential-side power source terminal TVBB, and a drain of the transistor Q1 is coupled to the first drive terminal TMA. A source of the transistor Q3 is coupled to the first high-potential-side power source terminal TVBB, and a drain of the transistor Q3 is coupled to the second drive terminal TMB.

The transistors Q2 and Q4 are N-type MOS transistors. A source of the transistor Q2 is coupled to the first low-potential-side power source terminal TMC, and a drain of the transistor Q2 is coupled to the first drive terminal TMA. A source of the transistor Q4 is coupled to the first low-potential-side power source terminal TMC, and a drain of the transistor Q4 is coupled to the second drive terminal TMB.

In a charging period, the control circuit 20 turns on the transistors Q1 and Q4 and turns off the transistors Q2 and Q3. The charging period may be referred to as a first period. At this time, a current flows from the first high-potential-side power source terminal TVBB to the transistor Q1, the first drive terminal TMA, the motor, the second drive terminal TMB, the transistor Q4, the first low-potential-side power source terminal TMC, the sense resistor RS, and the ground node NVSS.

In a decay period, the control circuit 20 turns on the transistors Q2 and Q3 and turns off the transistors Q1 and Q4. The decay period may be referred to as a second period. At this time, a current flows from the ground node NVSS to the sense resistor RS, the first low-potential-side power source terminal TMC, the transistor Q2, the first drive terminal TMA, the motor, the second drive terminal TMB, the transistor Q3, and the first high-potential-side power source terminal TVBB.

The voltage VS at the one end of the sense resistor RS changes with a current flowing through the sense resistor RS. The control circuit 20 repeats the charging period and the decay period based on the detection result signal RQ, which is the result of comparison between the voltage VS and the reference voltage VR. Accordingly, control is performed such that a current flowing through the motor becomes a current corresponding to the reference voltage VR.

A direction in which a current flows through the sense resistor RS is a direction from the first low-potential-side power source terminal TMC to the ground node NVSS in the charging period and is a direction from the ground node NVSS to the first low-potential-side power source terminal TMC in the decay period. Therefore, the voltage VS at the one end of the sense resistor RS is a positive voltage in the charging period and is a negative voltage in the decay period. That is, regarding the bridge circuit, noise is caused due to positive and negative surge currents in a normal operation of driving the motor.

When the first low-potential-side power source terminal TMC is coupled to a ground line of the switching control circuit 40, the noise described above may influence the switching control circuit 40 and thus the motor driver 210 may malfunction. For example, in the decay period, the voltage VS at the one end of the sense resistor RS becomes a voltage lower than the ground voltage VSS. When the first low-potential-side power source terminal TMC is coupled to the ground line of the switching control circuit 40, the reference voltage VR cannot function as a reference voltage when the voltage VS becomes a negative voltage since the reference voltage VR is generated based on the voltage VS. Accordingly, the comparison circuit 36 may not be able to perform appropriate voltage comparison, and the control circuit 20 may not be able to perform appropriate switching control.

Therefore, in order to separate the switching control circuit 40 from the voltage VS, the ground line of the switching control circuit 40 is coupled to the second low-potential-side power source terminal TMD. Since the second low-potential-side power source terminal TMD is coupled to the ground node NVSS without the sense resistor RS interposed therebetween, the ground of the switching control circuit 40 is basically not influenced by a change in voltage VS.

In the example shown in FIG. 1, the bidirectional diode 50 is provided as an electrostatic protection circuit in order to secure a discharge path at the time of application of static electricity between the first low-potential-side power source terminal TMC and the second low-potential-side power source terminal TMD. The electrostatic protection circuit needs to protect a circuit from static electricity and separate the ground of the switching control circuit 40 from a change in voltage VS. However, in the case of the bidirectional diode 50, the protection and the separation may not be achieved together. This point will be described below.

The bidirectional diode 50 includes a first diode and a second diode coupled in parallel between the first low-potential-side power source terminal TMC and the second low-potential-side power source terminal TMD. The forward direction of the first diode is a direction from the first low-potential-side power source terminal TMC to the second low-potential-side power source terminal TMD. The forward direction of the second diode is a direction from the second low-potential-side power source terminal TMD to the first low-potential-side power source terminal TMC. FIG. 1 shows an example in which one stage of first diodes and one stage of second diodes are provided.

For example, it will be assumed that static electricity is applied to the first low-potential-side power source terminal TMC with the second low-potential-side power source terminal TMD serving as a ground. A discharge path at the time of application of positive static electricity is a path from the first low-potential-side power source terminal TMC to the bidirectional diode 50 and the second low-potential-side power source terminal TMD and a discharge path at the time of application of negative static electricity is a path from the second low-potential-side power source terminal TMD to the bidirectional diode 50 and the first low-potential-side power source terminal TMC.

Figure 3:
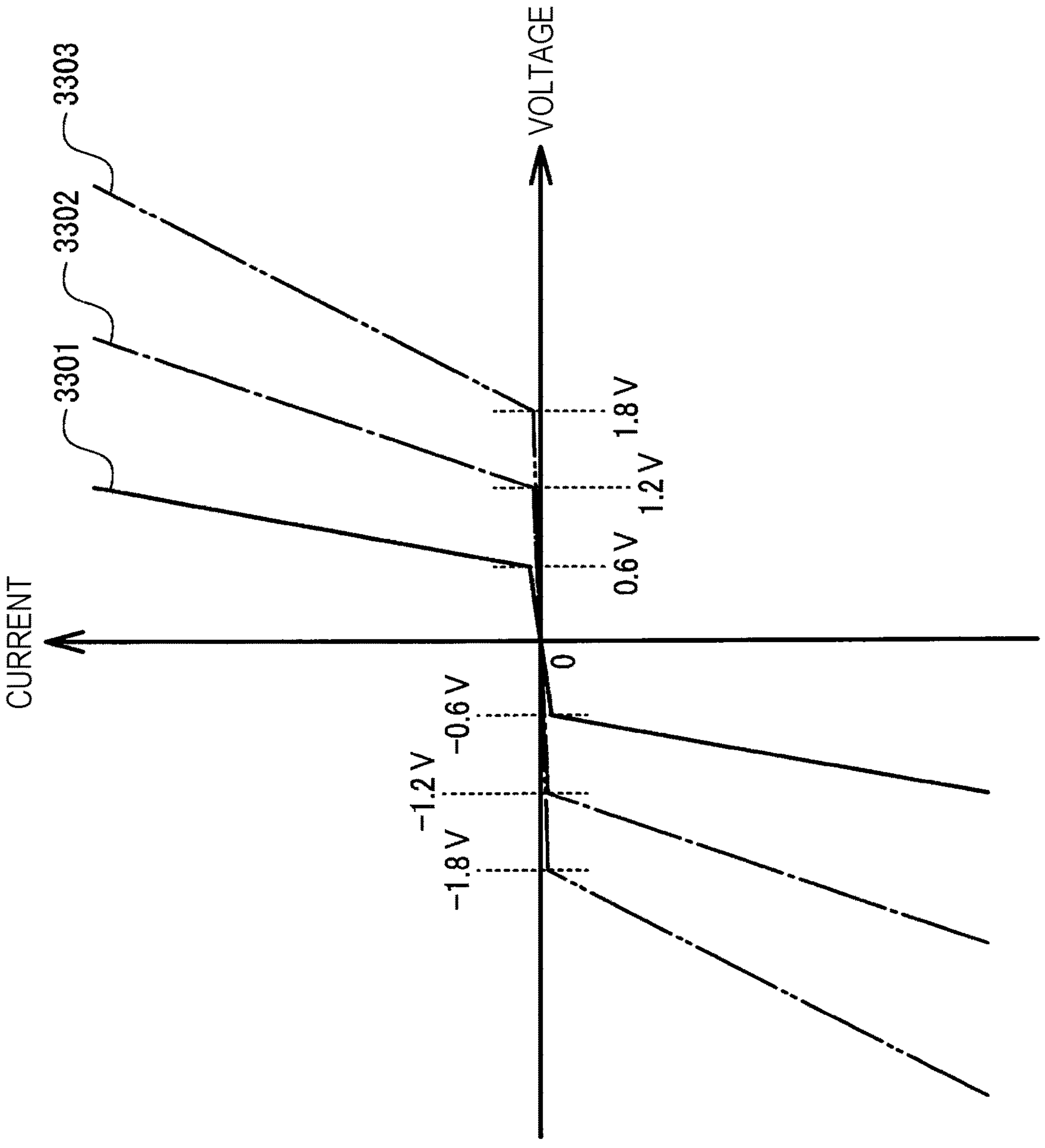
FIG. 3 shows an example of voltage-current characteristics of the bidirectional diode.

FIG. 3 is an example of voltage-current characteristics of the bidirectional diode. The horizontal axis represents a voltage applied to both ends of the bidirectional diode 50. The vertical axis represents a current flowing through the bidirectional diode 50. A line 3301 shows the characteristics exhibited when one stage of first diodes and one stage of second diodes are provided. A line 3302 shows the characteristics exhibited when two stages of first diodes and two stages of second diodes are provided. A line 3303 shows the characteristics exhibited when three stages of first diodes and three stages of second diodes are provided.

It will be assumed that the forward voltage of one stage of diodes is 0.6 V. As represented by the line 3301, in the case of one stage of diodes, almost no current flows through the bidirectional diode 50 in a range of −0.6 V to +0.6 V. Therefore, in the normal operation of driving the motor, noise in the range of −0.6 V to +0.6 V is blocked and does not reach the switching control circuit 40. When an electrostatic voltage falls outside the range of −0.6 V to +0.6 V at the time of application of static electricity, the bidirectional diode 50 is discharged. A clamping voltage is −0.6 V or less or +0.6 V or more.

When the amplitude of noise is large, it is possible to set a noise-blocking range to a range of −1.2 V to +1.2 V or a range of −1.8 V to +1.8 V by providing two or three stages of diodes. However, since the clamping voltage depends on the voltage range of noise that can be blocked, widening the voltage range of noise that can be blocked results in an increase in clamping voltage, which may increase the probability of electrostatic breakdown.

Figure 4:
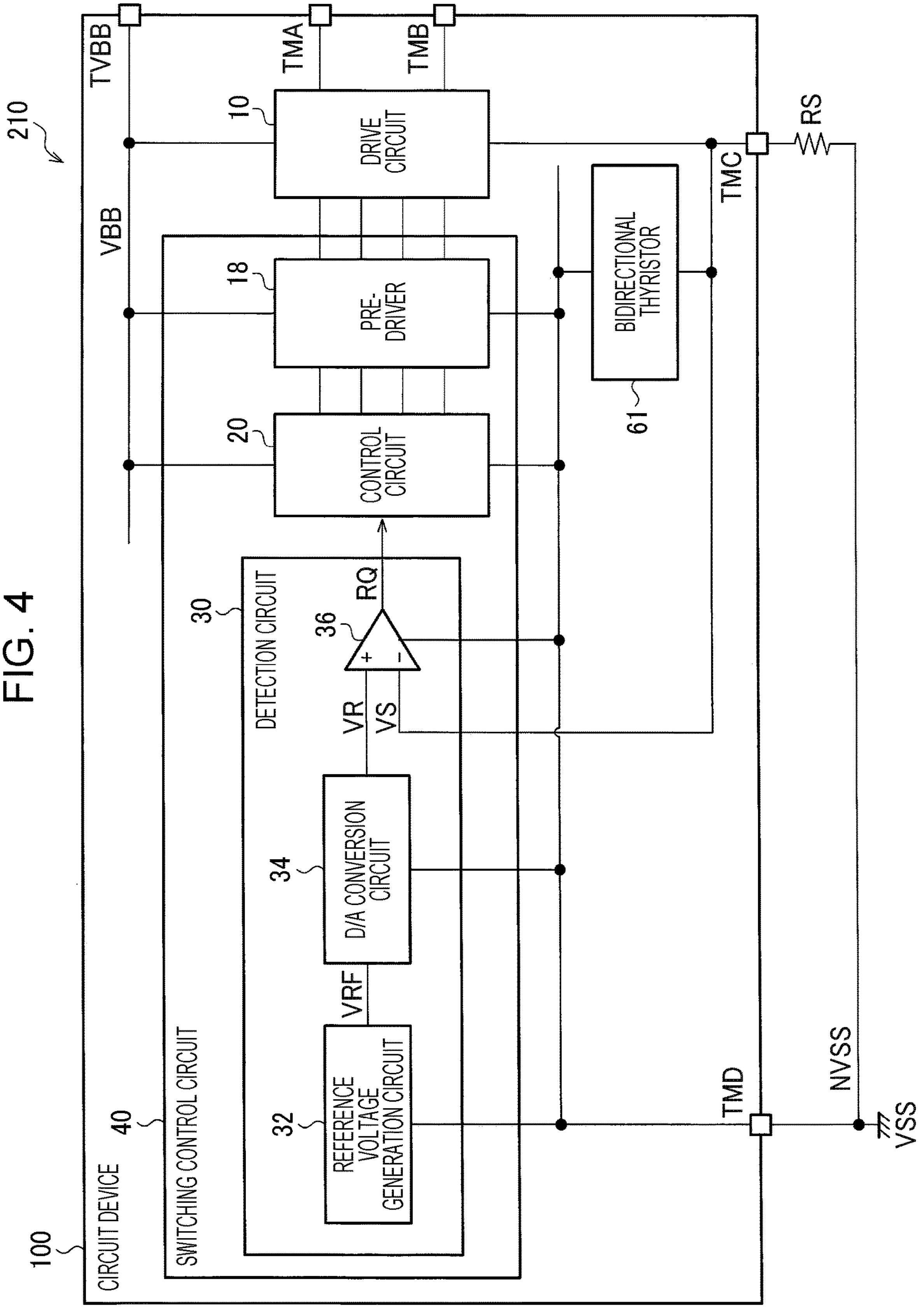
FIG. 4 shows a first configuration example of the circuit device.

FIG. 4 is a first configuration example of the circuit device. The circuit device 100 includes the drive circuit 10, the switching control circuit 40, a bidirectional thyristor 61, the first low-potential-side power source terminal TMC, the second low-potential-side power source terminal TMD, the first high-potential-side power source terminal TVBB, the first drive terminal TMA, and the second drive terminal TMB.

The operation of the motor driver 210 is the same as that in FIG. 1. In FIG. 4, the bidirectional thyristor 61 is provided as an electrostatic protection circuit between the first low-potential-side power source terminal TMC and the second low-potential-side power source terminal TMD. One end of the bidirectional thyristor 61 is coupled to the first low-potential-side power source terminal TMC, and another end of the bidirectional thyristor 61 is coupled to the second low-potential-side power source terminal TMD.

Figure 5:
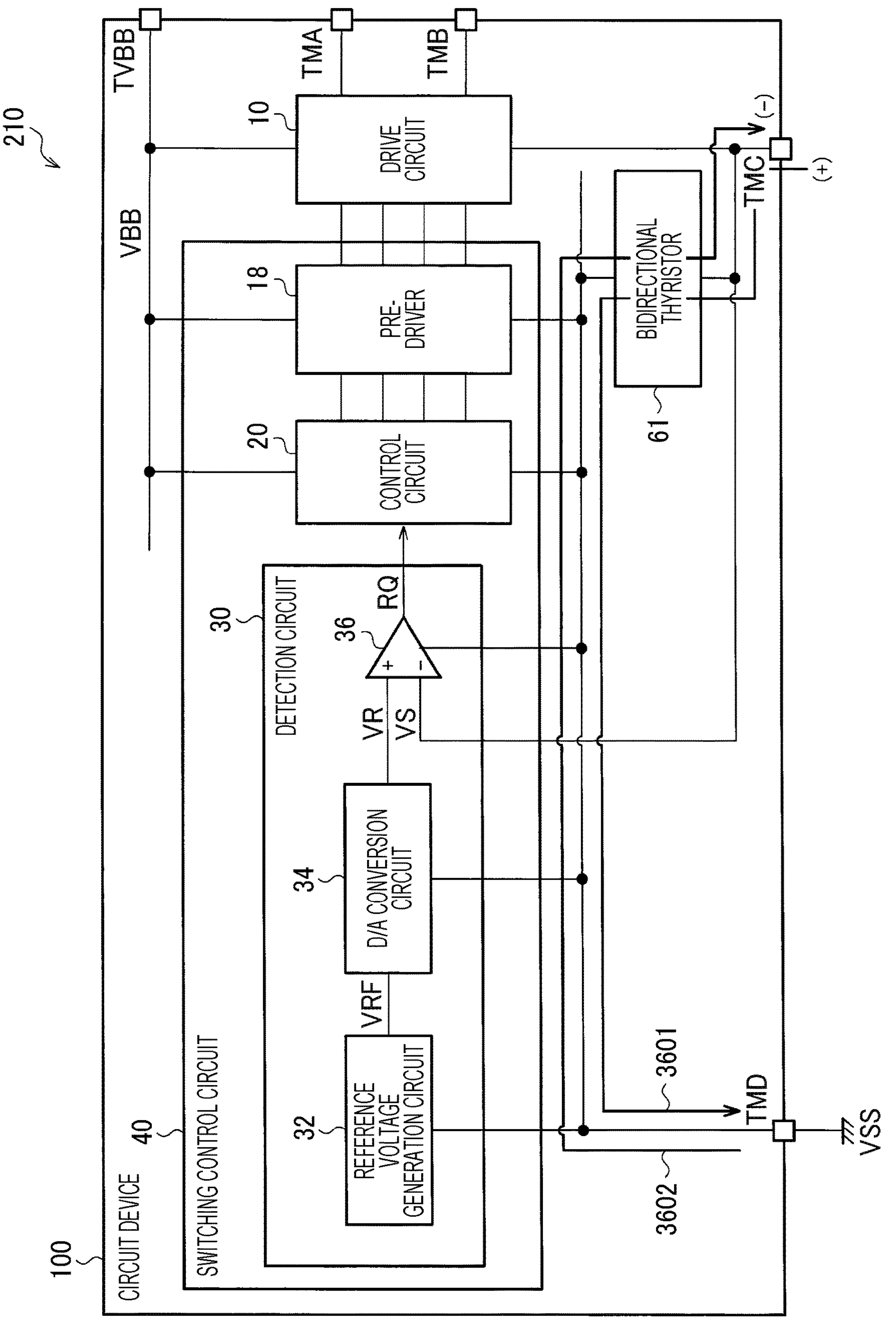
FIG. 5 shows a discharge path at the time of application of static electricity in the first configuration example.

FIG. 5 is a diagram showing a discharge path at the time of application of static electricity in the first configuration example. For example, it will be assumed that static electricity is applied to the first low-potential-side power source terminal TMC with the second low-potential-side power source terminal TMD serving as a ground. An arrow 3601 is a discharge path at the time of application of positive static electricity. The discharge path is a path from the first low-potential-side power source terminal TMC to the bidirectional thyristor 61 and the second low-potential-side power source terminal TMD. An arrow 3602 is a discharge path at the time of application of negative static electricity. The discharge path is a path from the second low-potential-side power source terminal TMD to the bidirectional thyristor 61 and the first low-potential-side power source terminal TMC.

Figure 6:
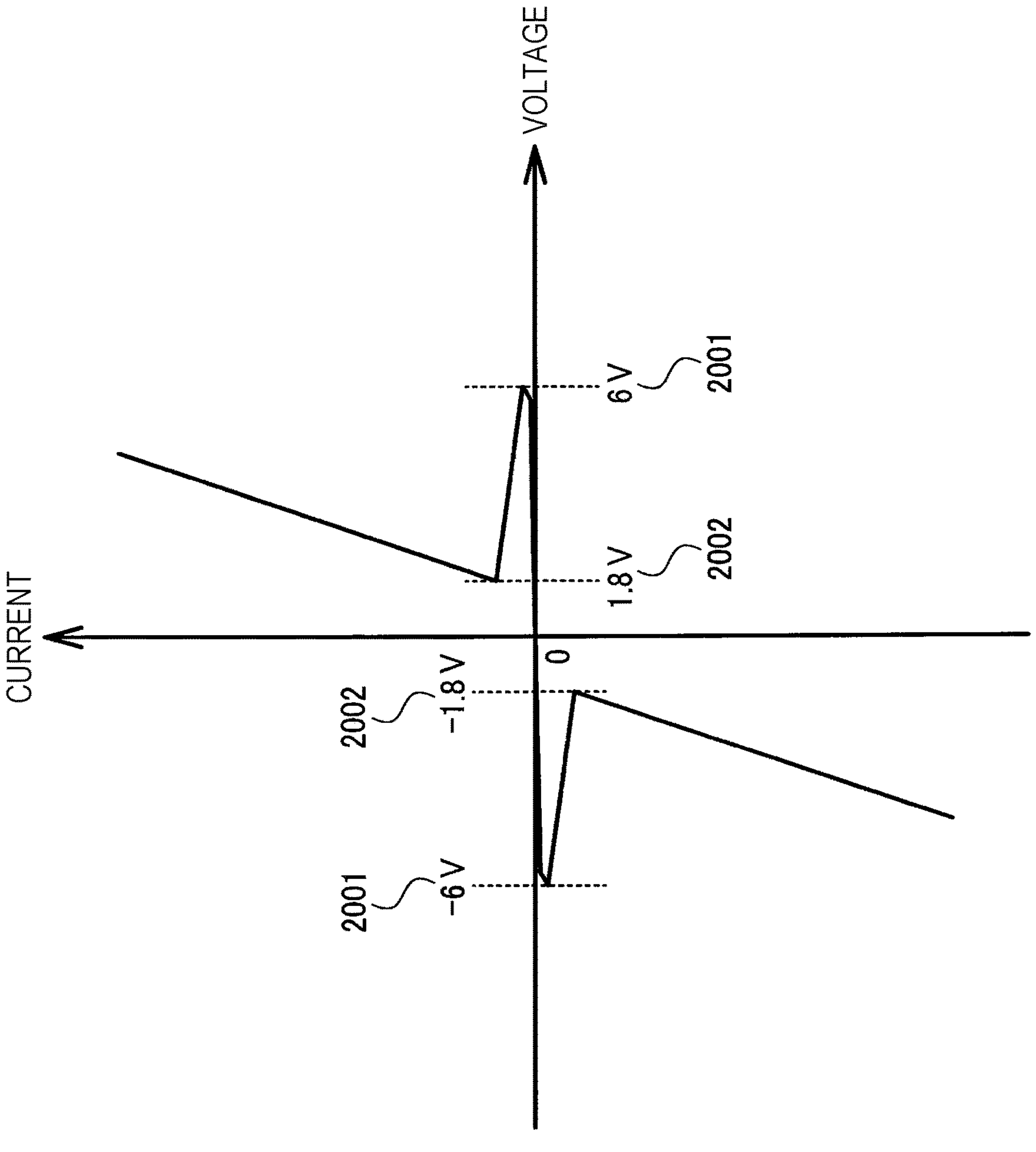
FIG. 6 shows an example of voltage-current characteristics of the bidirectional thyristor.

FIG. 6 is an example of voltage-current characteristics of the bidirectional thyristor. The horizontal axis represents a voltage applied to both ends of the bidirectional thyristor 61. The vertical axis represents a current flowing through the bidirectional thyristor 61. Voltages represented by a reference numeral 2001 are the trigger voltages of the bidirectional thyristor 61, and voltages represented by a reference numeral 2002 are the holding voltages of the bidirectional thyristor 61. Here, an example in which a trigger voltage is 6 V and a holding voltage is 1.8 V will be described.

No current flows through the bidirectional thyristor 61 until a voltage applied thereto falls outside a range of −6 V to +6 V. Therefore, in the normal operation of driving the motor, noise in the range of −6 V to +6 V is blocked and does not reach the switching control circuit 40. When an electrostatic voltage exceeds the trigger voltage at the time of application of static electricity, the bidirectional thyristor 61 is turned on and is discharged. When the bidirectional thyristor 61 is turned on, the clamping voltage is −1.8 V or less or +1.8 V or more.

The clamping voltage of the bidirectional thyristor 61 corresponds to the clamping voltage of three stages of bidirectional diodes. Meanwhile, while the three stages of bidirectional diodes can block noise in a range of −1.8 V to +1.8 V, the bidirectional thyristor 61 can block noise in a range of −6 V to +6 V. That is, with the bidirectional thyristor 61, it is possible to widen a noise-blockable voltage range in comparison with the bidirectional diode 50 while securing the same level of electrostatic resistance. Conversely, with the bidirectional thyristor 61, it is also possible to lower the clamping voltage for an increase in electrostatic resistance in comparison with the bidirectional diode while securing the same noise-blockable voltage range. As described above, with the bidirectional thyristor 61, it is possible to achieve both protection of a circuit from static electricity and separation of the ground of the switching control circuit 40 from a change in voltage VS.

As the bidirectional thyristor 61, various bidirectional thyristors having known configurations may be used. Alternatively, a bidirectional thyristor 1 described below may also be used as the bidirectional thyristor 61.

Figure 7:
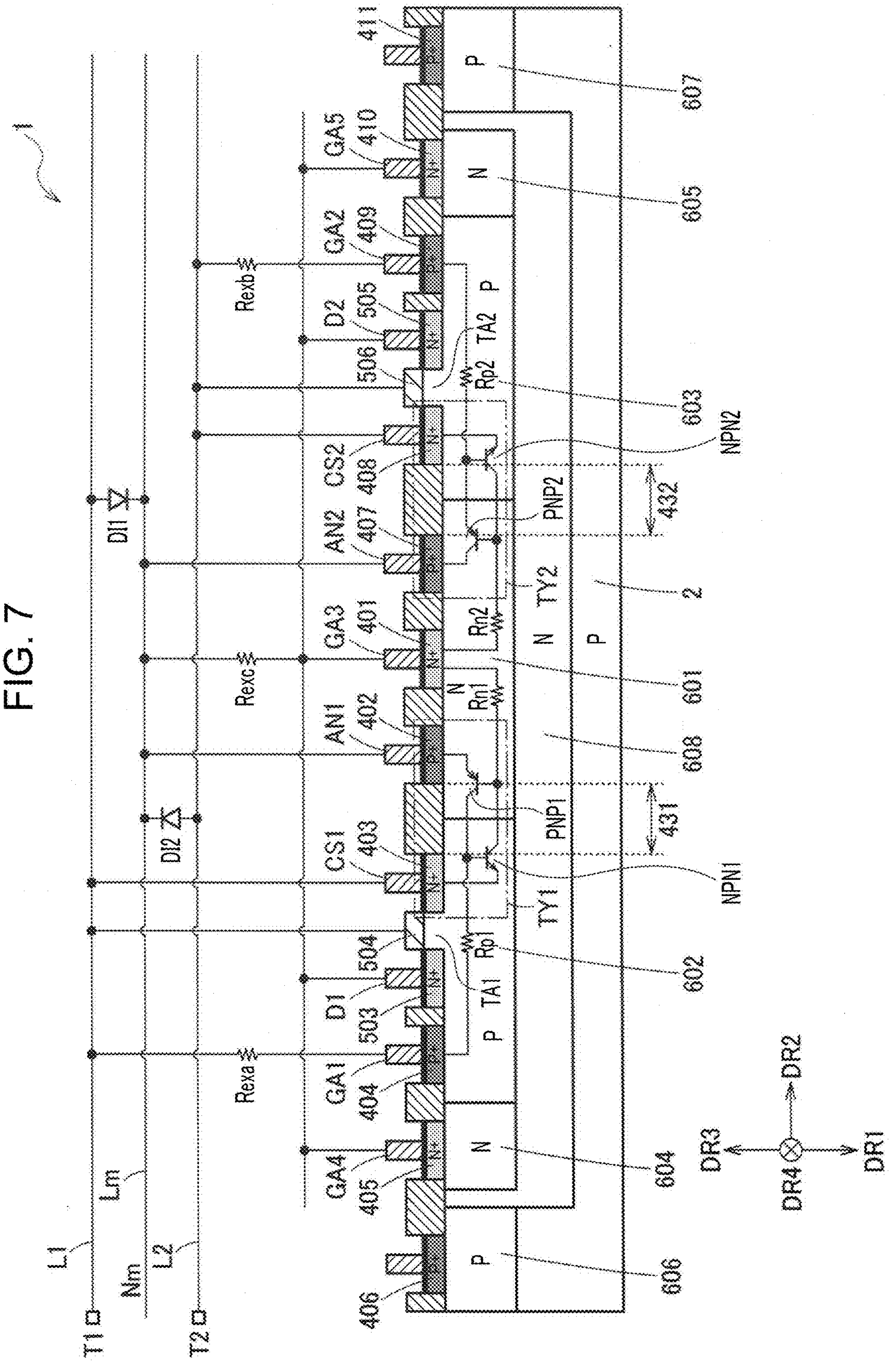
FIG. 7 shows a detailed configuration example of the bidirectional thyristor.
Figure 8:
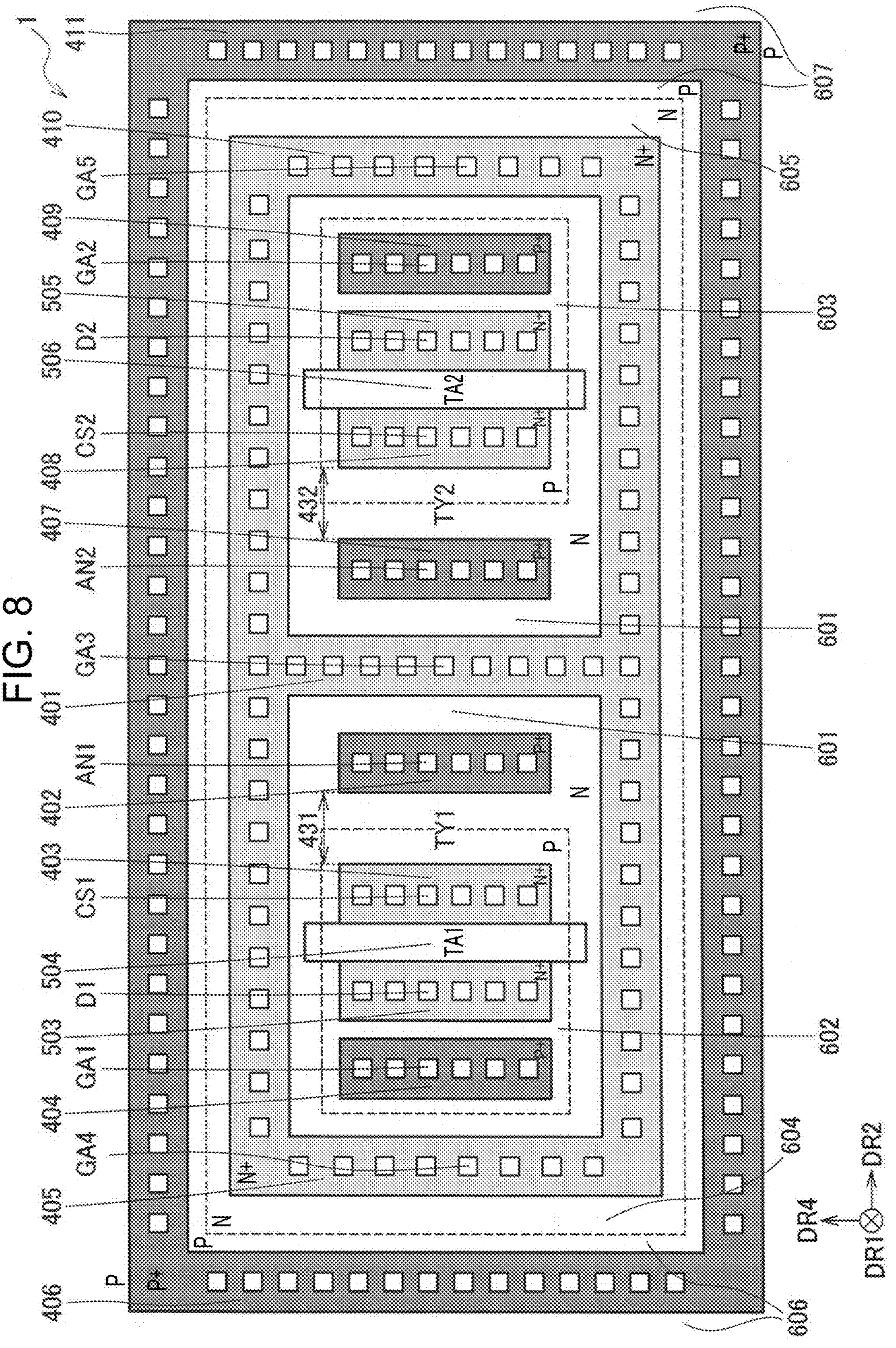
FIG. 8 shows a detailed configuration example of the bidirectional thyristor.

FIGS. 7 and 8 are detailed configuration examples of the bidirectional thyristor. FIG. 7 shows a substrate configuration of the bidirectional thyristor 1 including a substrate 2 and elements formed at the substrate 2.

The substrate 2 is, for example, a Si substrate, and a Si substrate doped with, for example, a P-type impurity element can be used. The substrate 2 may be referred to as a semiconductor substrate. As shown in FIG. 7, a downward direction with respect to a plane including the substrate 2 will be referred to as a first direction DR1. The downward direction is a direction from a front surface toward a rear surface in a thickness direction of the substrate 2. A direction opposite to the first direction DR1, that is, an upward direction with respect to the plane including the substrate 2 will be referred to as a third direction DR3. That is, the first direction DR1 and the third direction DR3 are directions orthogonal to the semiconductor substrate. In addition, a direction along the plane including the substrate 2 will be referred to as a second direction DR2. As shown in FIG. 8 described later, the second direction DR2 is a direction along a direction in which, for example, a first impurity region 503, a first anode region 402, a first cathode region 403, and the like are alternately disposed. In addition, a direction along the plane including the substrate 2 and orthogonal to the second direction DR2 will be referred to as a fourth direction DR4. A "plan view" means a view of the bidirectional thyristor 1 and the like as seen in the third direction DR3.

As shown in FIG. 7, the bidirectional thyristor 1 of the present embodiment includes the first anode region 402, the first cathode region 403, the first impurity region 503, a first gate region 404, a second anode region 407, a second cathode region 408, a second impurity region 505, a second gate region 409, and a third gate region 401.

The first anode region 402 is provided in a region of an N-type first well 601, and is coupled to an anode line Lm, which is an intermediate node Nm, via contacts AN1. The first anode region 402 is an impurity region doped with, for example, a P-type impurity element.

Here, the intermediate node Nm is a node that is coupled to a first cathode line L1 via a first diode element DI1 and that is coupled to a second cathode line L2 via a second diode element DI2. As will be described with reference to FIG. 9 and the like later, for example, when a positive potential is applied to a first cathode terminal T1 and a ground potential is applied to a second cathode terminal T2, the anode line Lm, which is the intermediate node Nm, becomes the anode side of a second thyristor TY2 which will described later, and the second cathode terminal T2 becomes the cathode side of the second thyristor TY2. In addition, for example, when a ground potential is applied to the first cathode terminal T1 and a positive potential is applied to the second cathode terminal T2, the anode line Lm, which is the intermediate node Nm, becomes the anode side of a first thyristor TY1 which will be described later, and the first cathode terminal T1 becomes the cathode side of the first thyristor TY1.

When the bidirectional thyristor 1 of FIG. 7 is applied to the bidirectional thyristor 61 of FIG. 4, one of the first cathode terminal T1 and the second cathode terminal T2 of FIG. 7 corresponds to the first low-potential-side power source terminal TMC of FIG. 4, and another of the first cathode terminal T1 and the second cathode terminal T2 corresponds to the second low-potential-side power source terminal TMD of FIG. 4.

The first cathode region 403 is provided at a P-type second well 602, is coupled to the first cathode line L1 via contacts CS1, and is coupled to the first cathode terminal T1. The first cathode region 403 is an impurity region doped with, for example, an N-type impurity element.

The first impurity region 503 is provided at the P-type second well 602 and is electrically coupled to the anode line Lm, which is the intermediate node Nm, via contacts D1 and a second resistor element Rexc. The first impurity region 503 is an impurity region doped with, for example, an N-type impurity element.

The third gate region 401 is provided in the region of the first well 601 and is electrically coupled to the anode line Lm, which is the intermediate node Nm, via contacts GA3 and the second resistor element Rexc. The third gate region 401 is an impurity region doped with, for example, an N-type impurity element.

FIG. 8 shows a configuration example of the bidirectional thyristor 1 in a plan view with respect to the substrate 2. FIG. 8 schematically shows the shape, the positional relationship, and the like of each of constituent requirements of the bidirectional thyristor 1 such as a diffusion layer, a well, a gate electrode, and a contact in a plan view. As shown in FIG. 8, in the plan view, the contacts GA3 are provided in the third gate region 401 to be arranged along the fourth direction DR4. In addition, the third gate region 401 is coupled, in a ring-like shape, to a fourth gate region 405 provided with contacts GA4 and a fifth gate region 410 provided with contacts GA5.

The contacts GA3, GA4, and GA5 and the contacts AN1, CS1, and D1 described above are electrode plugs each of which is made by embedding a metal material such as tungsten in a via hole provided on a diffusion layer, for example.

The first gate region 404 is provided in a region of the second well 602, is electrically coupled to the first cathode line L1 via contacts GA1 and a first resistor element Rexa, and is coupled to the first cathode terminal T1. The first gate region 404 is an impurity region doped with, for example, a P-type impurity element.

The second anode region 407 is provided in the region of the N-type first well 601, and is coupled to the anode line Lm, which is the intermediate node Nm, via contacts AN2. The second anode region 407 is an impurity region doped with, for example, a P-type impurity element.

The second cathode region 408 is provided at a P-type third well 603, is coupled to the second cathode line L2 via contacts CS2, and is coupled to the second cathode terminal T2. The second cathode region 408 is an impurity region doped with, for example, an N-type impurity element.

The second impurity region 505 is provided at the P-type third well 603 and is electrically coupled to the anode line Lm, which is the intermediate node Nm, via contacts D2 and the second resistor element Rexc. The second impurity region 505 is an impurity region doped with, for example, an N-type impurity element.

The second gate region 409 is provided in the region of the second well 602, is electrically coupled to the second cathode line L2 via contacts GA2 and a third resistor element Rexb, and is coupled to the second cathode terminal T2. The second gate region 409 is an impurity region doped with, for example, a P-type impurity element.

The first resistor element Rexa, the third resistor element Rexb, the second resistor element Rexc, and the like can be provided by using, for example, polysilicon resistors formed at an insulating film (not shown). In addition, as shown in FIG. 7, each resistor element is coupled by a metal wire.

As shown in FIG. 7, the first well 601 is an N-type impurity region provided in the first direction DR1 with respect to the first anode region 402, the third gate region 401, and the second anode region 407. The first well 601 is in contact with a deep well 608 on a side to which the first direction DR1 extends. The impurity concentration of the first well 601 is lower than the impurity concentration of the third gate region 401 although the first well 601 is, for example, an N-type impurity region, as with the third gate region 401. As described above, when a direction orthogonal to the semiconductor substrate is referred to as the first direction DR1, the first well 601 is provided in the first direction DR1 with respect to the first anode region 402, the third gate region 401, the second anode region 407, and the like.

As shown in FIG. 7, the second well 602 is a P-type region provided in the first direction DR1 with respect to the first cathode region 403, the first impurity region 503, and the first gate region 404. The second well 602 is in contact with the deep well 608 on the side to which the first direction DR1 extends. The impurity concentration of the second well 602 is lower than the impurity concentration of the first gate region 404 although the second well 602 is, for example, a P-type region, as with the first gate region 404.

The third well 603 is a P-type region provided in the first direction DR1 with respect to the second cathode region 408, the second impurity region 505, and the second gate region 409. The third well 603 is in contact with the deep well 608 on the side to which the first direction DR1 extends. The impurity concentration of the third well 603 is lower than the impurity concentration of the second gate region 409 although the third well 603 is, for example, a P-type region, as with the second gate region 409.

A fourth well 604 and a fifth well 605 are N-type regions provided in the first direction DR1 with respect to the fourth gate region 405 and the fifth gate region 410, respectively. The fourth well 604 and the fifth well 605 are in contact with the deep well 608 on the side to which the first direction DR1 extends. The impurity concentrations of the fourth well 604 and the fifth well 605 are lower than the impurity concentrations of the fourth gate region 405 and the fifth gate region 410 although the fourth well 604 and the fifth well 605 are, for example, N-type regions, as with the fourth gate region 405 and the fifth gate region 410. As shown in FIG. 8, the fourth well 604 and the fifth well 605 are coupled to the first well 601, on which the third gate region 401 is provided, as seen in a plan view.

The deep well 608 is an N-type region provided in the first direction DR1 with respect to the first well 601 to the fifth well 605. The deep well 608 is in contact with the substrate 2 on the side to which the first direction DR1 extends.

A sixth well 606 and a seventh well 607 are regions provided in the first direction DR1 with respect to diffusion regions 406 and 411, respectively. Each of the sixth well 606, the seventh well 607, and the diffusion regions 406 and 411 is a P-type impurity region. The sixth well 606 and the seventh well 607 are in contact with the substrate 2 on the side to which the first direction DR1 extends. In addition, the sixth well 606 is in contact with the deep well 608 on a side to which the second direction DR2 extends and the seventh well 607 is in contact with the deep well 608 on a side opposite to the side to which the second direction DR2 extends. In addition, the impurity concentrations of the sixth well 606 and the seventh well 607 are lower than the impurity concentrations of the diffusion regions 406 and 411. In addition, as shown in FIG. 8, the diffusion region 406 and the diffusion region 411 are coupled to each other in a ring-like shape. In addition, the sixth well 606 and the seventh well 607 that are provided, with respect to the diffusion regions 406 and 411, on the side to which the first direction DR1 extends are also coupled to each other in a ring-like shape.

In FIG. 7, as represented by a one-dot chain line frame, the P-type first anode region 402, the N-type first well 601, the P-type second well 602, and the N-type first cathode region 403 constitute a PNPN thyristor in which the first anode region 402 is an anode, the first cathode region 403 is a cathode, and the second well 602 is a gate. In addition, the PNPN thyristor including the first anode region 402, the first well 601, the second well 602, and the first cathode region 403 will be referred to as the first thyristor TY1.

Here, regarding the first thyristor TY1, a configuration including the N-type first well 601, the P-type second well 602, and the N-type first cathode region 403 can be regarded as an NPN bipolar transistor in which the first cathode region 403 is an emitter, the second well 602 is a base, and the first well 601 is a collector. In addition, regarding the first thyristor TY1, a configuration including the P-type first anode region 402, the N-type first well 601, and the P-type second well 602 can be regarded as a PNP bipolar transistor in which the first anode region 402 is an emitter, the first well 601 is a base, and the second well 602 is a collector. In addition, a transistor including the N-type first well 601, the P-type second well 602, and the N-type first cathode region 403 will be referred to as an NPN bipolar transistor NPN1, and a transistor including the P-type first anode region 402, the N-type first well 601, and the P-type second well 602 will be referred to as a PNP bipolar transistor PNP1.

In addition, in FIG. 7, as represented by a one-dot chain line frame, the P-type second anode region 407, the N-type first well 601, the P-type third well 603, and the N-type second cathode region 408 constitute a PNPN thyristor in which the second anode region 407 is an anode, the second cathode region 408 is a cathode, and the third well 603 is a gate. In addition, the PNPN thyristor including the second anode region 407, the first well 601, the third well 603, and the second cathode region 408 will be referred to as the second thyristor TY2.

Here, regarding the second thyristor TY2, a configuration including the N-type first well 601, the P-type third well 603, and the N-type second cathode region 408 can be regarded as an NPN bipolar transistor in which the second cathode region 408 is an emitter, the third well 603 is a base, and the first well 601 is a collector. In addition, regarding the second thyristor TY2, a configuration including the second anode region 407, the first well 601, and the third well 603 can be regarded as a PNP bipolar transistor in which the third well 603 is an emitter, the first well 601 is a base, and the second anode region 407 is a collector. In addition, a transistor including the N-type first well 601, the P-type third well 603, and the N-type second cathode region 408 will be referred to as an NPN bipolar transistor NPN2, and a transistor including the P-type second anode region 407, the N-type first well 601, and the P-type third well 603 will be referred to as a PNP bipolar transistor PNP2.

A well resistor Rn1 is a resistor of the first well 601. A voltage between the emitter and the base of the PNP bipolar transistor PNP1 is generated based on voltage drop at the well resistor Rn1 and voltage drop at the second resistor element Rexc. In addition, a well resistor Rp1 is a resistor of the second well 602. A voltage between the emitter and the base of the NPN bipolar transistor NPN1 is generated based on voltage drop at the well resistor Rp1 and voltage drop at the first resistor element Rexa.

A well resistor Rn2 is a resistor of the first well 601. A voltage between the emitter and the base of the PNP bipolar transistor PNP2 is generated based on voltage drop at the well resistor Rn2 and voltage drop at the second resistor element Rexc. In addition, a well resistor Rp2 is a resistor of the third well 603. A voltage between the emitter and the base of the NPN bipolar transistor NPN2 is generated based on voltage drop at the well resistor Rp3 and voltage drop at the third resistor element Rexb.

As shown in FIG. 7, a first gate electrode 504 is provided between the first cathode region 403 and the first impurity region 503 in the region of the second well 602. The first gate electrode 504 is made of, for example, a conductive material such as polysilicon. In the bidirectional thyristor 1, a first transistor TAL is configured in which the first cathode region 403, the first impurity region 503, the first gate electrode 504, and the second well 602 are a source, a drain, a gate, and a substrate, respectively. The first transistor TAL is an N-type MOS transistor.

Note that the first cathode region 403 of the first thyristor TY1 also functions as the source of the first transistor TA1 and the second well 602 corresponding to the gate of the first thyristor TY1 also functions as the substrate of the first transistor TA1. In addition, the first impurity region 503 corresponding to the drain of the first transistor TA1 is coupled to the third gate region 401 by a metal wire, is coupled to the anode line Lm via the second resistor element Rexc, and is coupled to the intermediate node Nm. The first gate electrode 504 corresponding to the gate of the first transistor TAL is coupled to the first cathode terminal T1 via the first cathode line L1. In addition, the first gate electrode 504 is coupled to the first cathode region 403 by a metal wire, and is coupled to the first gate region 404 via the first resistor element Rexa.

As shown in FIG. 7, a second gate electrode 506 is provided between the second cathode region 408 and the second impurity region 505 in a region of the third well 603. The second gate electrode 506 is made of, for example, a conductive material such as polysilicon, as with the first gate electrode 504. In the bidirectional thyristor 1, a second transistor TA2 is configured in which the second cathode region 408, the second impurity region 505, the second gate electrode 506, and the third well 603 are a source, a drain, a gate, and a substrate, respectively. The second transistor TA2 is an N-type MOS transistor.

Note that the second cathode region 408 of the second thyristor TY2 also functions as the source of the second transistor TA2 and the third well 603 corresponding to the gate of the second thyristor TY2 also functions as the substrate of the second transistor TA2. In addition, the second impurity region 505 corresponding to the drain of the second transistor TA2 is coupled to the third gate region 401 by a metal wire, is coupled to the anode line Lm via the second resistor element Rexc, and is coupled to the intermediate node Nm. The second gate electrode 506 corresponding to the gate of the second transistor TA2 is coupled to the second cathode terminal T2 via the second cathode line L2. In addition, the second gate electrode 506 is coupled to the second cathode region 408 by a metal wire, and is coupled to the second gate region 409 via the third resistor element Rexb.

As shown in FIG. 8, the first transistor TA1, the first thyristor TY1, the second thyristor TY2, and the second transistor TA2 are provided to be arranged along the second direction DR2. In addition, the first transistor TA1, the first thyristor TY1, the second thyristor TY2, and the second transistor TA2 are provided line-symmetrically with respect to the third gate region 401 provided at the center of the bidirectional thyristor 1.

In addition, in the present embodiment, the first impurity region 503 corresponding to the drain of the first transistor TA1 and the first gate electrode 504 are disposed on a side opposite to the first anode region 402 with respect to the first cathode region 403 which is the cathode of the first thyristor TY1. In addition, similarly, the second impurity region 505 corresponding to the drain of the second transistor TA2 and the second gate electrode 506 are disposed on a side opposite to the second anode region 407 with respect to the second cathode region 408 which is the cathode of the second thyristor TY2.

Figure 9:
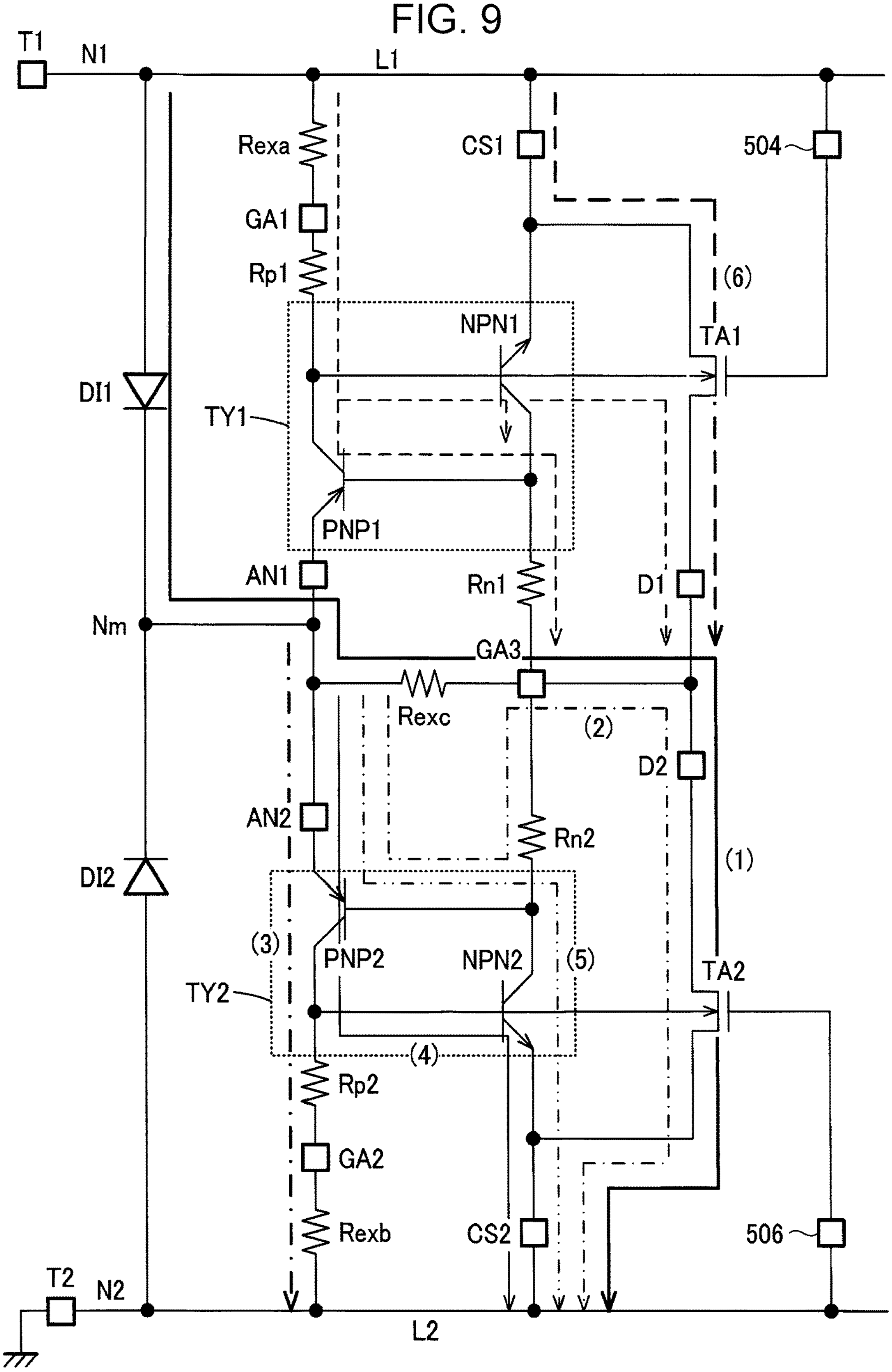
FIG. 9 shows an equivalent circuit diagram of the bidirectional thyristor.

FIG. 9 is an equivalent circuit diagram of the bidirectional thyristor shown in FIGS. 7 and 8. As shown in FIG. 9, the first diode element DI1, the first thyristor TY1, and the first transistor TA1 are provided between a node N1 of the first cathode terminal T1 and the intermediate node Nm. In addition, the second diode element DI2, the second thyristor TY2, and the second transistor TA2 are provided between the intermediate node Nm and a node N2 of the second cathode terminal T2.

The first diode element DI1 is provided such that the forward direction thereof is a direction from the node N1 of the first cathode terminal T1 to the intermediate node Nm, and the second diode element DI2 is provided such that the forward direction thereof is a direction from the node N2 of the second cathode terminal T2 to the intermediate node Nm.

In the equivalent circuit diagram of FIG. 9, contacts such as the contacts GA1 described with reference to FIG. 7 are represented by square marks.

Hereinafter, it will be assumed that positive static electricity is applied to the first cathode terminal T1 with the second cathode terminal T2 serving as a ground. FIG. 9 shows current paths at that time with arrows (1) to (6).

First, when breakdown occurs at a P-N junction between the drain and the substrate of the second transistor TA2, the start of a transition to an ON state of the second thyristor TY2 is triggered by the breakdown. The arrow (1) shows a current path through which a current flows when the breakdown occurs at the P-N junction. That is, the current flows from the first cathode terminal T1 to the second cathode terminal T2 through the first diode element DI1, the second resistor element Rexc, and the second transistor TA2.

In addition, when a current flows through the path represented by the arrow (1), the potential of the base of the PNP bipolar transistor PNP2 is lowered with respect to the emitter of the PNP bipolar transistor PNP2 due to voltage drop at the second resistor element Rexc, and a base current of the PNP bipolar transistor PNP2 flows. Therefore, a current flows through a path represented by the arrow (2). Then, since the base current of the PNP bipolar transistor PNP2 flows, the PNP bipolar transistor PNP2 is turned on and a current flows through a path represented by the arrow (3). Then, when the current flows through the path represented by the arrow (3), a voltage at the base of the NPN bipolar transistor NPN2 is increased with respect to the emitter of the NPN bipolar transistor NPN2 due to voltage drop at the well resistor Rp2 and the third resistor element Rexb, and a base current flows through the NPN bipolar transistor NPN2 along a path represented by the arrow (4). Then, since the base current of the NPN bipolar transistor NPN2 flows, the NPN bipolar transistor NPN2 is turned on and a current flows through a path represented by the arrow (5). Then, the first transistor TA1 is turned on when a potential difference between the source and the drain exceeds a threshold value, and a current flows through a path represented by the arrow (6).

Regarding the bidirectional thyristor 1 described with reference to FIGS. 7 to 9, a trigger voltage is determined by the breakdown voltage of the first transistor TA1 or the second transistor TA2, which is an N-type MOS transistor. The trigger voltage is, for example, 6 V. In addition, generally, the forward voltage of a diode is 0.6 V, and the holding voltage of a thyristor is approximately 1.2 V. Therefore, the holding voltage of the bidirectional thyristor 1 is +1.8 V or −1.8 V. Accordingly, the voltage-current characteristics of the bidirectional thyristor 1 described with reference to FIG. 6 are obtained.

According to the configuration example of the bidirectional thyristor 1 described with reference to FIGS. 7 to 9, since there is no other impurity region provided between the first anode region 402 and the first cathode region 403, a distance 431 between the first anode region 402 and the first cathode region 403 is short. In addition, there is no other impurity region provided between the second anode region 407 and the second cathode region 408, a distance 432 between the second anode region 407 and the second cathode region 408 is short. Accordingly, parasitic resistance between the anode regions and the cathode regions is small, and thus the holding voltage of the bidirectional thyristor 1 can be lowered. Accordingly, the clamping voltage of the bidirectional thyristor 1 can be lowered.

Figure 10:
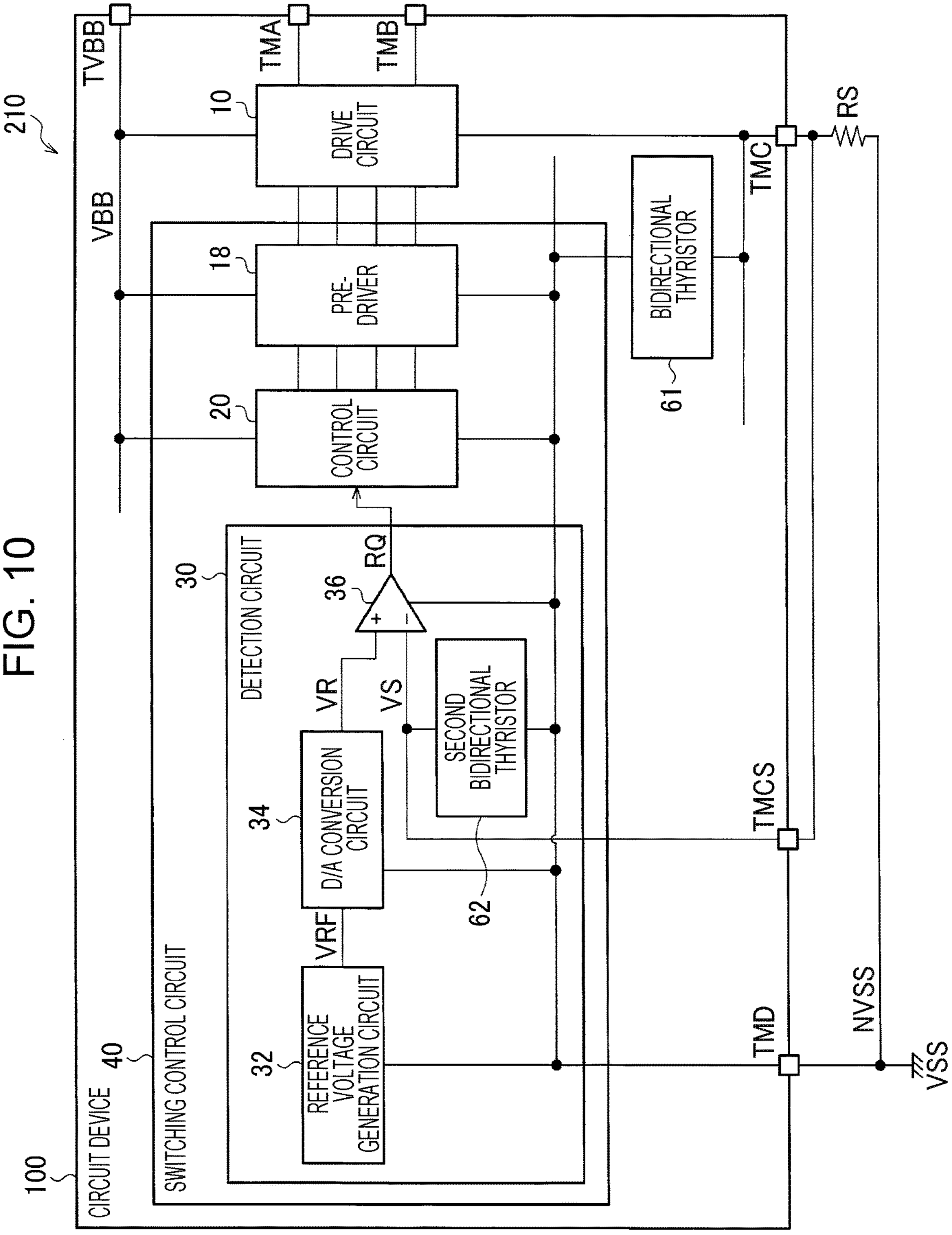
FIG. 10 shows a second configuration example of the circuit device.

FIG. 10 is a second configuration example of the circuit device. In the case of the second configuration example, the circuit device 100 further includes, with respect to the first configuration example, a second bidirectional thyristor 62 and a third low-potential-side power source terminal TMCS. The operation of the motor driver 210 is the same as that in FIG. 1.

The first low-potential-side power source terminal TMC and the third low-potential-side power source terminal TMCS are coupled to the one end of the sense resistor RS. An inversion input terminal of the comparison circuit 36 is coupled to the third low-potential-side power source terminal TMCS. The voltage VS at the one end of the sense resistor RS is input to the comparison circuit 36 via the third low-potential-side power source terminal TMCS.

One end of the second bidirectional thyristor 62 is coupled to the third low-potential-side power source terminal TMCS, and another end of the second bidirectional thyristor 62 is coupled to the second low-potential-side power source terminal TMD. As the second bidirectional thyristor 62, the bidirectional thyristor 1 described with reference to FIGS. 7 to 9 may be used, or various bidirectional thyristors having known configurations may also be used.

Figure 11:
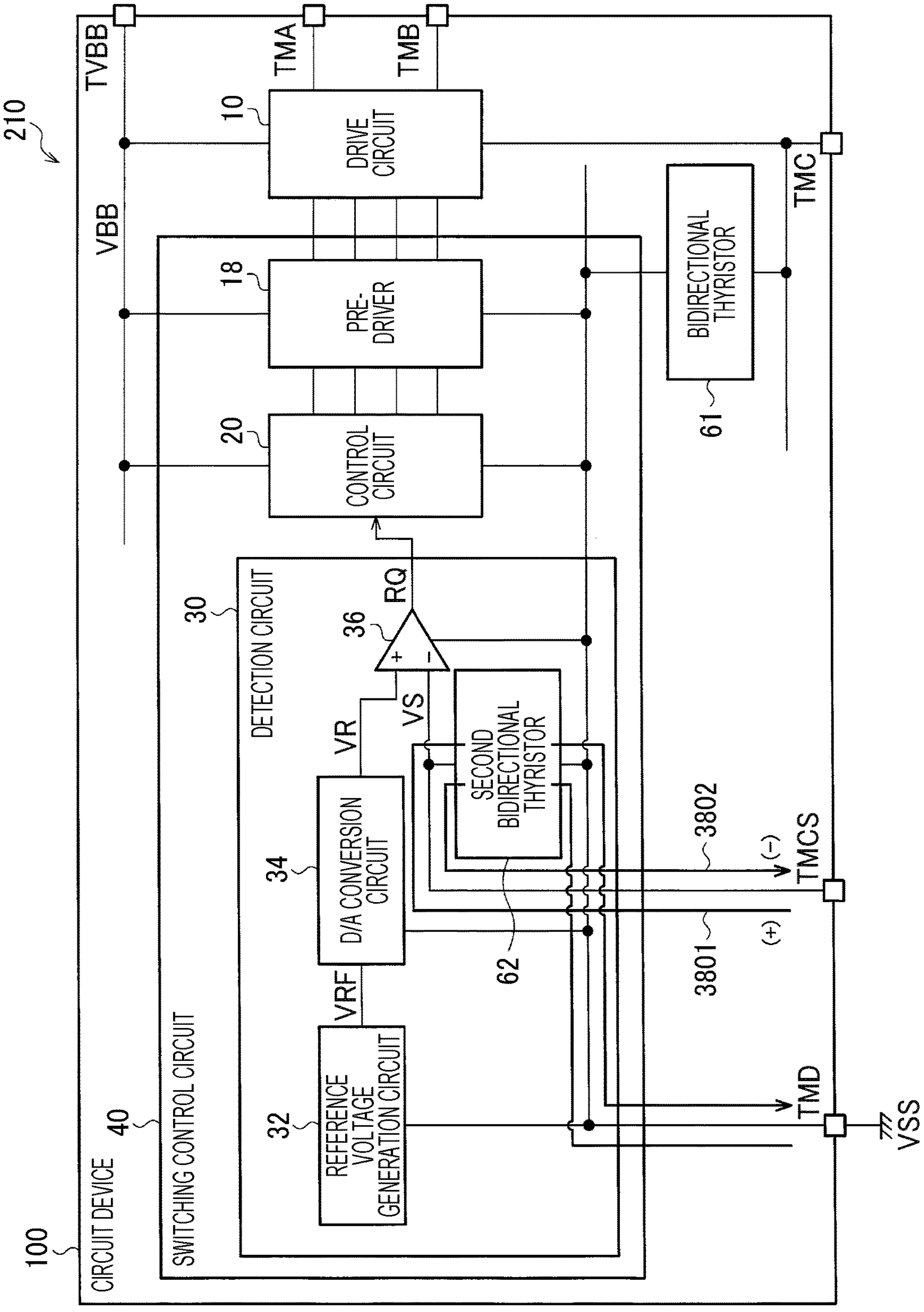
FIG. 11 shows a discharge path at the time of application of static electricity in the second configuration example.

FIG. 11 is a diagram showing a discharge path at the time of application of static electricity in the second configuration example. For example, it will be assumed that static electricity is applied to the third low-potential-side power source terminal TMCS with the second low-potential-side power source terminal TMD serving as a ground. An arrow 3801 is a discharge path at the time of application of positive static electricity. The discharge path is a path from the third low-potential-side power source terminal TMCS to the second bidirectional thyristor 62 and the second low-potential-side power source terminal TMD. An arrow 3802 is a discharge path at the time of application of negative static electricity. The discharge path is a path from the second low-potential-side power source terminal TMD to the second bidirectional thyristor 62 and the third low-potential-side power source terminal TMCS.

In the first configuration example of FIG. 4, the drive circuit 10, the first low-potential-side power source terminal TMC, and the comparison circuit 36 are coupled to each other inside the semiconductor substrate. Since a current path between the drive circuit 10 and the ground node NVSS includes the first low-potential-side power source terminal TMC and the sense resistor RS, the voltage VS input to the comparison circuit 36 is influenced by the parasitic resistance of a bonding wire of the first low-potential-side power source terminal TMC, a lead frame of a package, and the like. Therefore, it is necessary to set the resistance value of the sense resistor RS in consideration of the parasitic resistance, and a variation in parasitic resistance becomes an error. That is, since the voltage VS, which is a detection voltage value, varies due to the parasitic resistance, the drive current of the motor also varies, and the operation of the motor may be adversely influenced.

According to the second configuration example of FIG. 10, the one end of the sense resistor RS and the comparison circuit 36 are coupled to each other via the third low-potential-side power source terminal TMCS different from the first low-potential-side power source terminal TMC. Accordingly, the voltage VS input to the comparison circuit 36 is not influenced by the parasitic resistance of the bonding wire of the first low-potential-side power source terminal TMC, the lead frame of the package, and the like. Accordingly, it is not necessary to set the resistance value of the sense resistor RS in consideration of the parasitic resistance, and a variation in parasitic resistance does not become an error. Note that the effect of providing the second bidirectional thyristor 62 as an electrostatic protection circuit is the same as the effect of providing the bidirectional thyristor 61.

Figure 12:
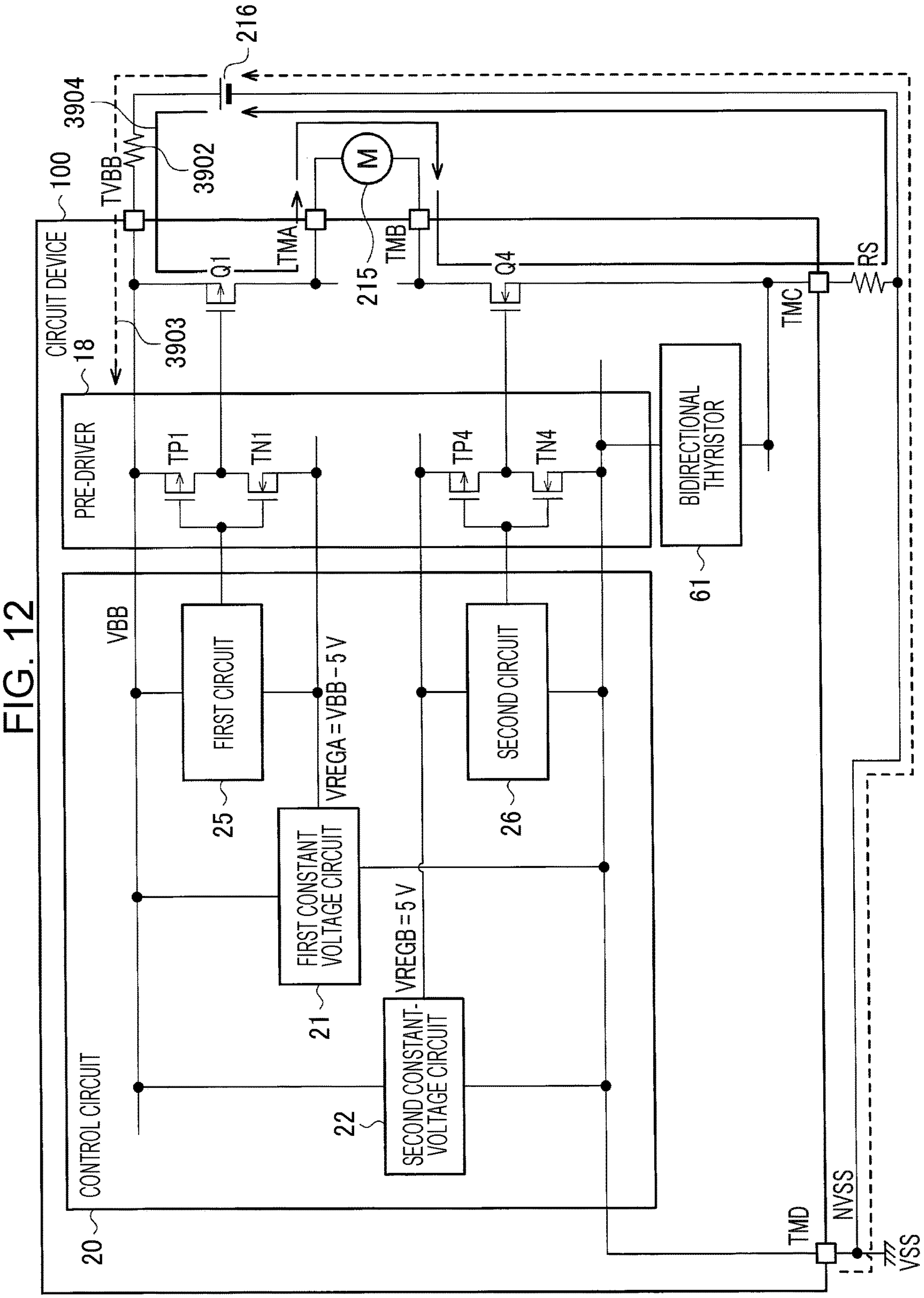
FIG. 12 shows a detailed configuration example of a control circuit and a pre-driver.
Figure 13:
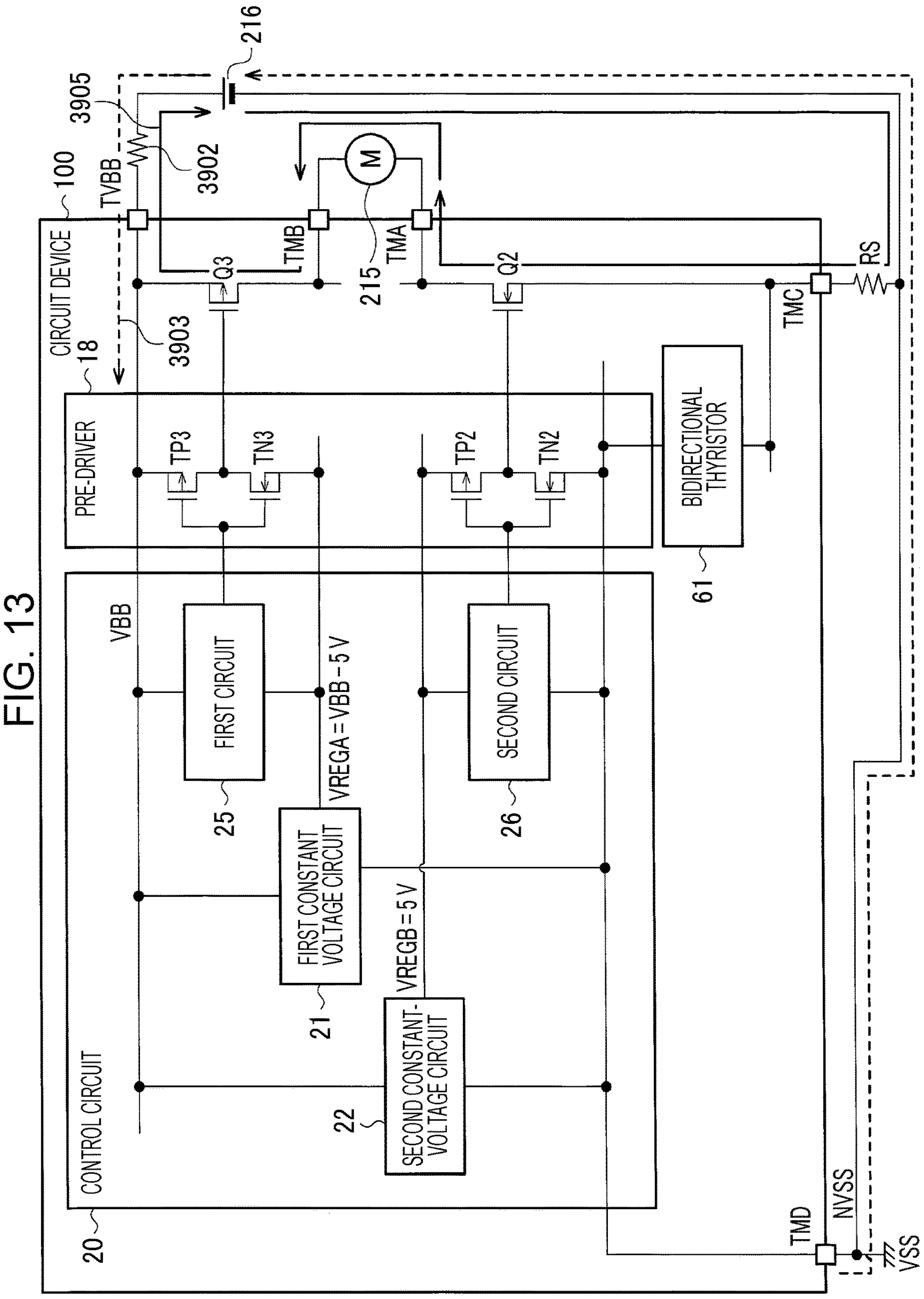
FIG. 13 shows a detailed configuration example of the control circuit and the pre-driver.

FIGS. 12 and 13 are detailed configuration examples of the control circuit and the pre-driver. The detection circuit 30 is not shown in FIGS. 12 and 13. FIG. 12 shows components related to the charging period only and shows a current path in the charging period. FIG. 13 shows components related to the decay period only and shows a current path in the decay period.

The first drive terminal TMA is coupled to one end of a motor 215 and the second drive terminal TMB is coupled to another end of the motor 215. The first high-potential-side power source terminal TVBB is coupled to a positive electrode terminal of a power source 216 and the ground node NVSS is coupled to a negative electrode terminal of the power source 216. The power source voltage supplied by the power source 216 is, for example, 40 V. The transistors Q1 to Q4 of the drive circuit 10 are high-withstand-voltage transistors, and are, for example, DMOS transistors. The "DMOS" is the abbreviation for "Double-Diffused MOS".

The control circuit 20 includes a first constant-voltage circuit 21, a second constant-voltage circuit 22, a first circuit 25, and a second circuit 26. The pre-driver 18 includes transistors TP1 to TP4 and TN1 to TN4. The transistors TP1 to TP4 are P-type MOS transistors. The transistors TN1 to TN4 are N-type MOS transistors.

The first constant-voltage circuit 21 generates, based on the power source voltage VBB, a first regulation voltage VREGA that is lower than the power source voltage VBB by a predetermined voltage. For example, when the predetermined voltage is 5 V, VREGA=VBB−5 V.

The second constant-voltage circuit 22 generates, based on the ground voltage VSS, a second regulation voltage VREGB equal to the predetermined voltage. VREGB<VREGA. For example, when the predetermined voltage is 5 V, VREGB=5 V.

The first circuit 25 operates with the power source voltage VBB and the first regulation voltage VREGA serving as power sources. The first circuit 25 outputs, based on the detection result signal RQ, a control signal to control the transistors Q1 and Q3 to be turned on or off.

The transistors TP1 and TN1 constitute an inverter with the power source voltage VBB and the first regulation voltage VREGA serving as power sources. The control signal from the first circuit 25 is input to the inverter and the inverter outputs a pre-drive signal to a gate of the transistor Q1.

The transistors TP3 and TN3 constitute an inverter with the power source voltage VBB and the first regulation voltage VREGA serving as power sources. The control signal from the first circuit 25 is input to the inverter and the inverter outputs a pre-drive signal to a gate of the transistor Q3.

The second circuit 26 operates with the second regulation voltage VREGB and the ground voltage VSS serving as power sources. The second circuit 26 outputs, based on the detection result signal RQ, a control signal to control the transistors Q2 and Q4 to be turned on or off.

The transistors TP2 and TN2 constitute an inverter with the second regulation voltage VREGB and the ground voltage VSS serving as power sources. The control signal from the second circuit 26 is input to the inverter and the inverter outputs a pre-drive signal to a gate of the transistor Q2.

The transistors TP4 and TN4 constitute an inverter with the second regulation voltage VREGB and the ground voltage VSS serving as power sources. The control signal from the second circuit 26 is input to the inverter and the inverter outputs a pre-drive signal to a gate of the transistor Q4.

As described above, for example, VREGA=VBB−5 V and VREGB=5 V. Therefore, transistors included in the first circuit 25, the second circuit 26, and the pre-driver 18 are transistors having withstand voltages lower than the withstand voltages of the transistors Q1 to Q4 of the drive circuit 10.

As represented by an arrow 3904 in FIG. 12, the current path in the charging period is a path from the positive electrode terminal of the power source 216 to the first high-potential-side power source terminal TVBB, the transistor Q1, the motor 215, the transistor Q4, and the first low-potential-side power source terminal TMC. As represented by an arrow 3905 in FIG. 13, the current path in the decay period is a path from the first low-potential-side power source terminal TMC to the transistor Q2, the motor 215, the transistor Q3, the first high-potential-side power source terminal TVBB, and the positive electrode terminal of the power source 216.

Figure 14:
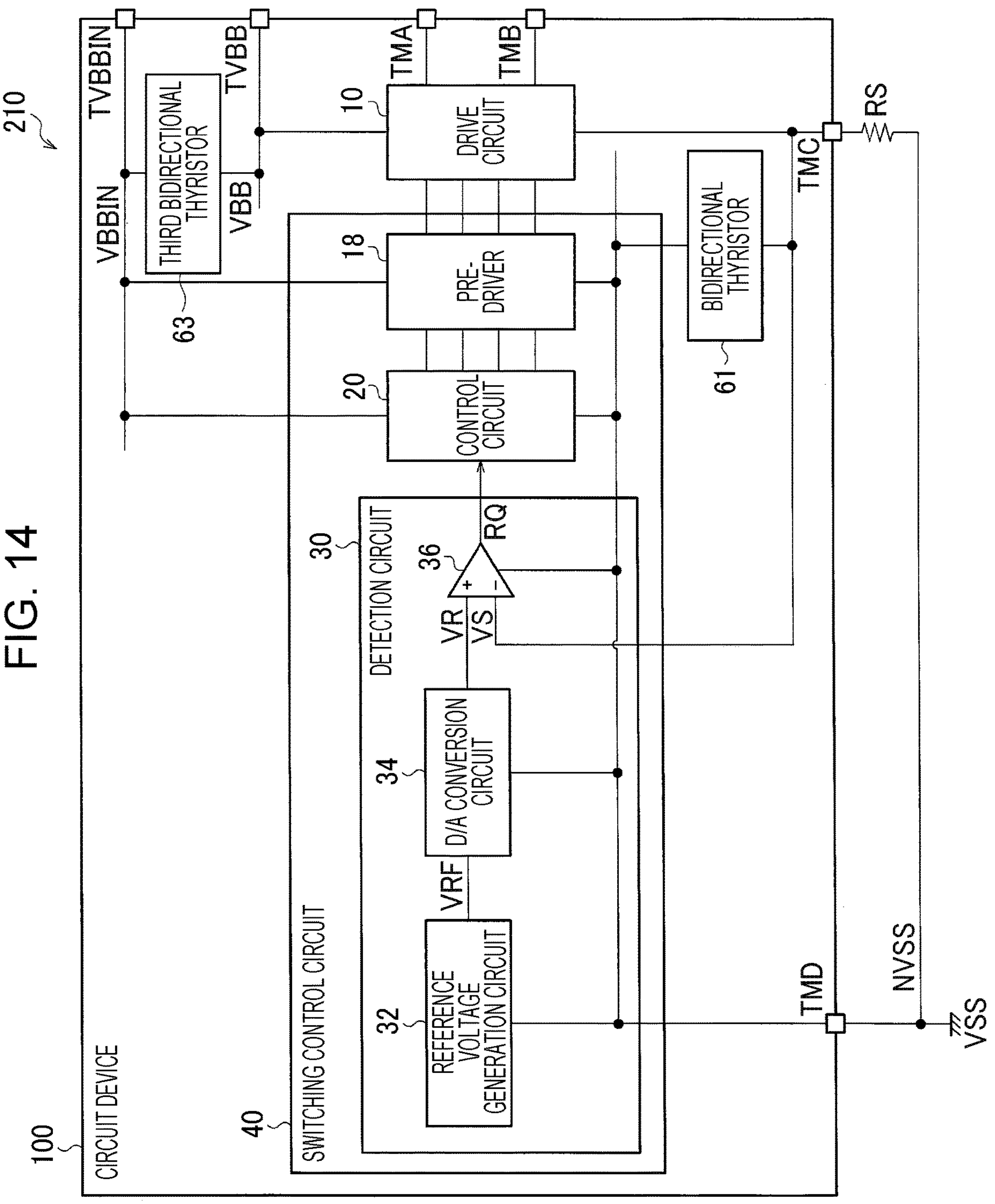
FIG. 14 shows a third configuration example of the circuit device.

FIG. 14 is a third configuration example of the circuit device. In the case of the present configuration example, the circuit device 100 further includes, with respect to the first configuration example, a third bidirectional thyristor 63 and a second high-potential-side power source terminal TVBBIN. Note that the second configuration example may be further combined with the third configuration example. The operation of the motor driver 210 is the same as that in FIG. 1.

Power source lines of the control circuit 20 and the pre-driver 18 are coupled to the second high-potential-side power source terminal TVBBIN. Power source voltages at the control circuit 20 and the pre-driver 18 are a power source voltage VBBIN supplied from the second high-potential-side power source terminal TVBBIN.

One end of the third bidirectional thyristor 63 is coupled to the first high-potential-side power source terminal TVBB, and another end of the third bidirectional thyristor 63 is coupled to the second high-potential-side power source terminal TVBBIN. As the third bidirectional thyristor 63, the bidirectional thyristor 1 described with reference to FIGS. 7 to 9 may be used, or various bidirectional thyristors having known configurations may also be used.

Figure 15:
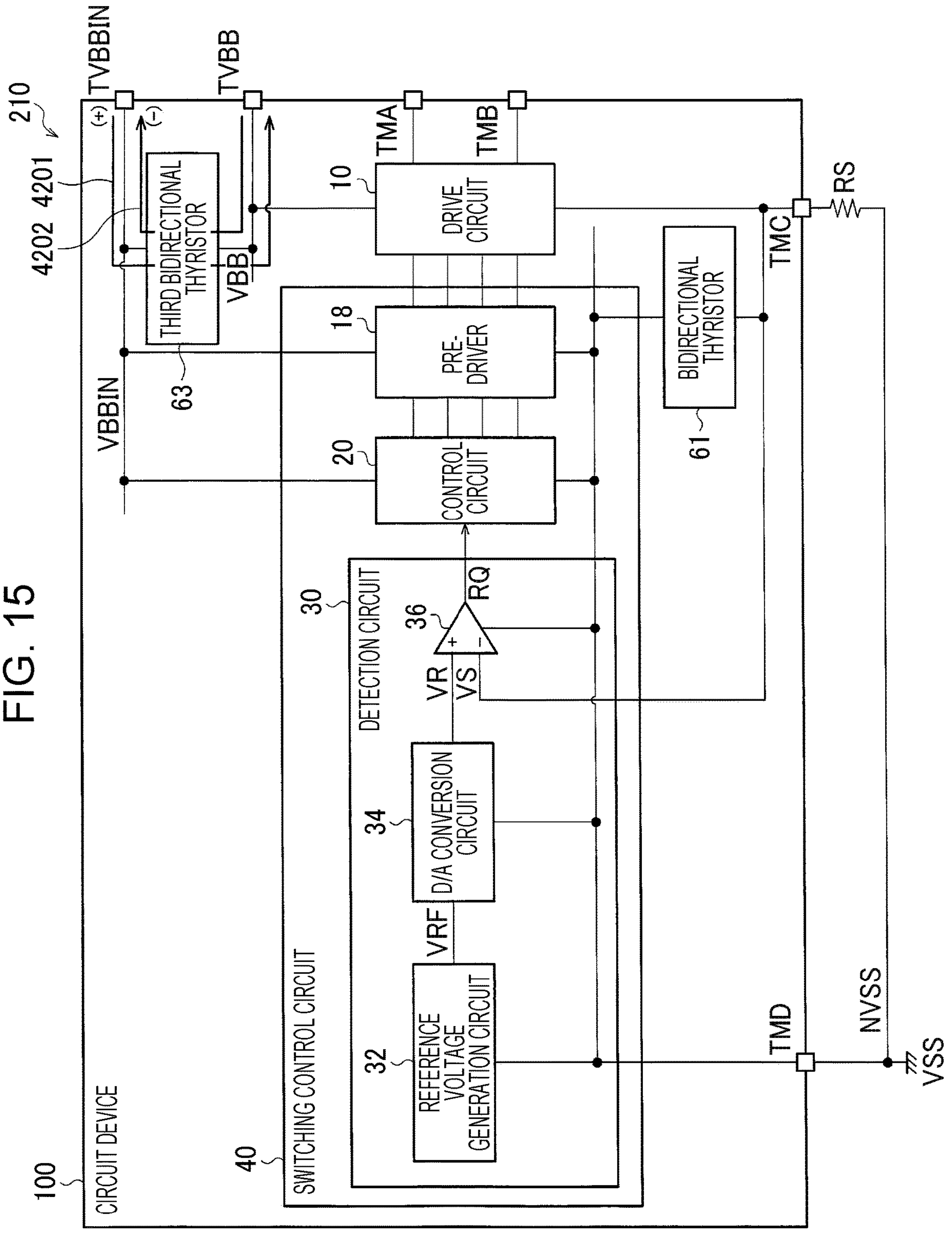
FIG. 15 shows a discharge path at the time of application of static electricity in the third configuration example.

FIG. 15 is a diagram showing a discharge path at the time of application of static electricity in the third configuration example. For example, it will be assumed that static electricity is applied to the second high-potential-side power source terminal TVBBIN with the first high-potential-side power source terminal TVBB serving as a ground. An arrow 4201 is a discharge path at the time of application of positive static electricity. The discharge path is a path from the second high-potential-side power source terminal TVBBIN to the third bidirectional thyristor 63 and the first high-potential-side power source terminal TVBB. An arrow 4202 is a discharge path at the time of application of negative static electricity. The discharge path is a path from the first high-potential-side power source terminal TVBB to the third bidirectional thyristor 63 and the second high-potential-side power source terminal TVBBIN.

In the configuration example shown in FIGS. 12 and 13, the motor driver 210 may malfunction due to noise of the power source voltage VBB. This point will be described below.

As shown in FIGS. 12 and 13, a parasitic resistor 3902 is provided between the positive electrode terminal of the power source 216 and the source of the transistor Q1. The parasitic resistor 3902 includes a parasitic resistor of a power source line and a parasitic resistor such as the bonding wire of the first high-potential-side power source terminal TVBB, a lead frame of a package, or the like. An arrow 3903 is a path through which an operating current of the control circuit 20 and the pre-driver 18 flows. The arrow 3903 extends through the parasitic resistor 3902. That is, the parasitic resistor 3902 is a common impedance between the power source lines of the control circuit 20 and the pre-driver 18 and the source of the transistor Q3.

As shown in FIG. 12, a current flows in a direction along the arrow 3904 in the charging period. Since the parasitic resistor 3902 is on the current path, the power source voltage VBB, which is the source voltage of the transistor Q1, is lower than a voltage at the positive electrode terminal of the power source 216. Since the parasitic resistor 3902 is a common impedance as described above, the power source voltage VBB at the control circuit 20 and the pre-driver 18 is also lower than a voltage at the positive electrode terminal of the power source 216. As shown in FIG. 13, a current flows in a direction along an arrow 3905 in the decay period. Since a direction in which the current flows is opposite to that in the charging period, the power source voltage VBB at the control circuit 20 and the pre-driver 18 is higher than the voltage at the positive electrode terminal of the power source 216.

As described above, regarding the bridge circuit, noise of the power source voltage VBB in the circuit device 100 is caused due to positive and negative surge currents in the normal operation of driving the motor. This noise may cause a malfunction of the control circuit 20 or the pre-driver 18. For example, the first constant-voltage circuit 21 generates the first regulation voltage VREGA based on the power source voltage VBB. Therefore, when the power source voltage VBB increases or decreases, the first regulation voltage VREGA may increase or decrease and a pre-driver that drives the transistor Q1 or Q3 may malfunction.

According to the third configuration example shown in FIG. 14, the power source lines of the control circuit 20 and the pre-driver 18 are coupled to the second high-potential-side power source terminal TVBBIN. Accordingly, the influence of the common impedance described above can be avoided. This point will be described below.

Figure 16:
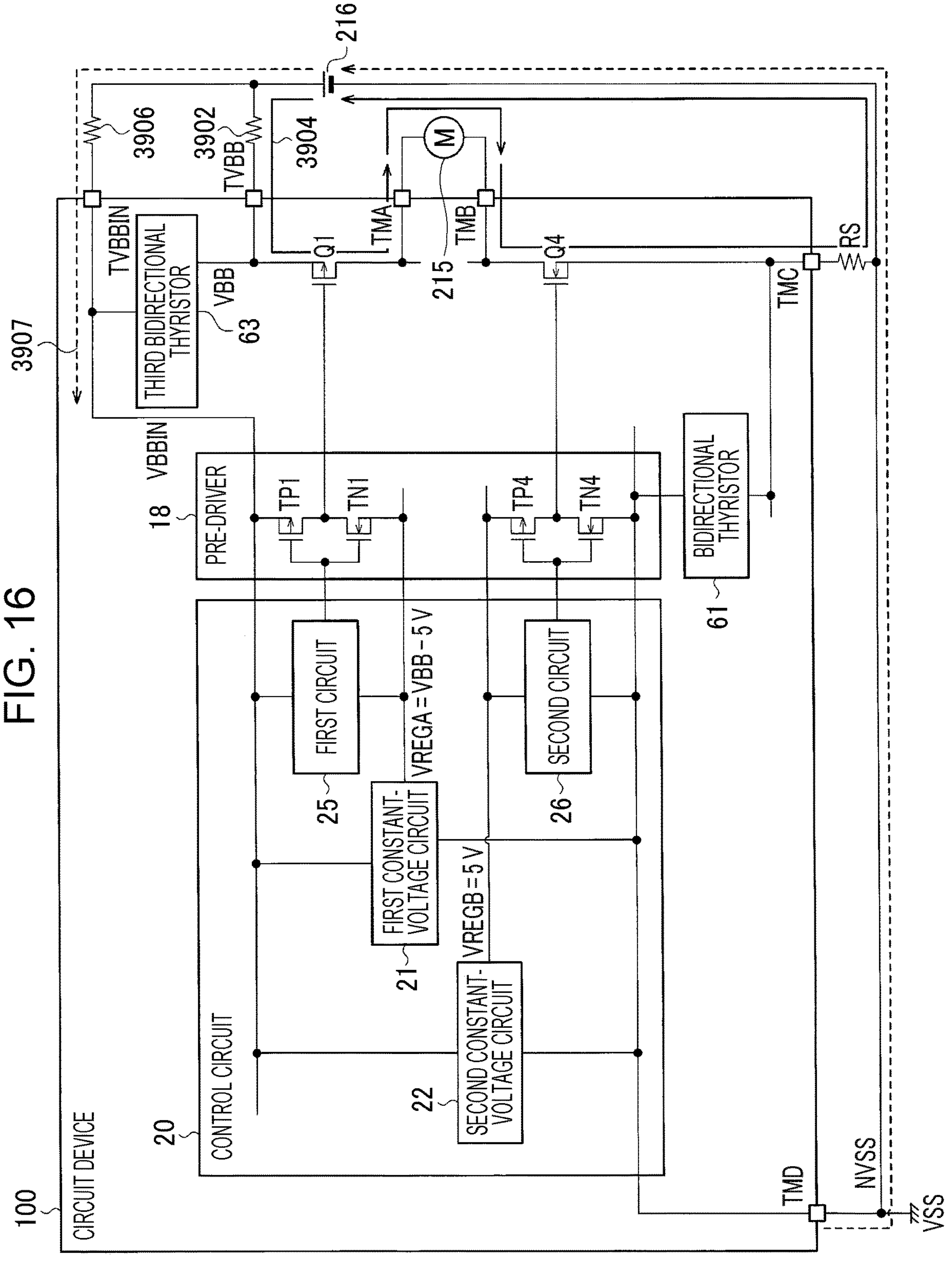
FIG. 16 shows a current path during a charging period of the third configuration example.
Figure 17:
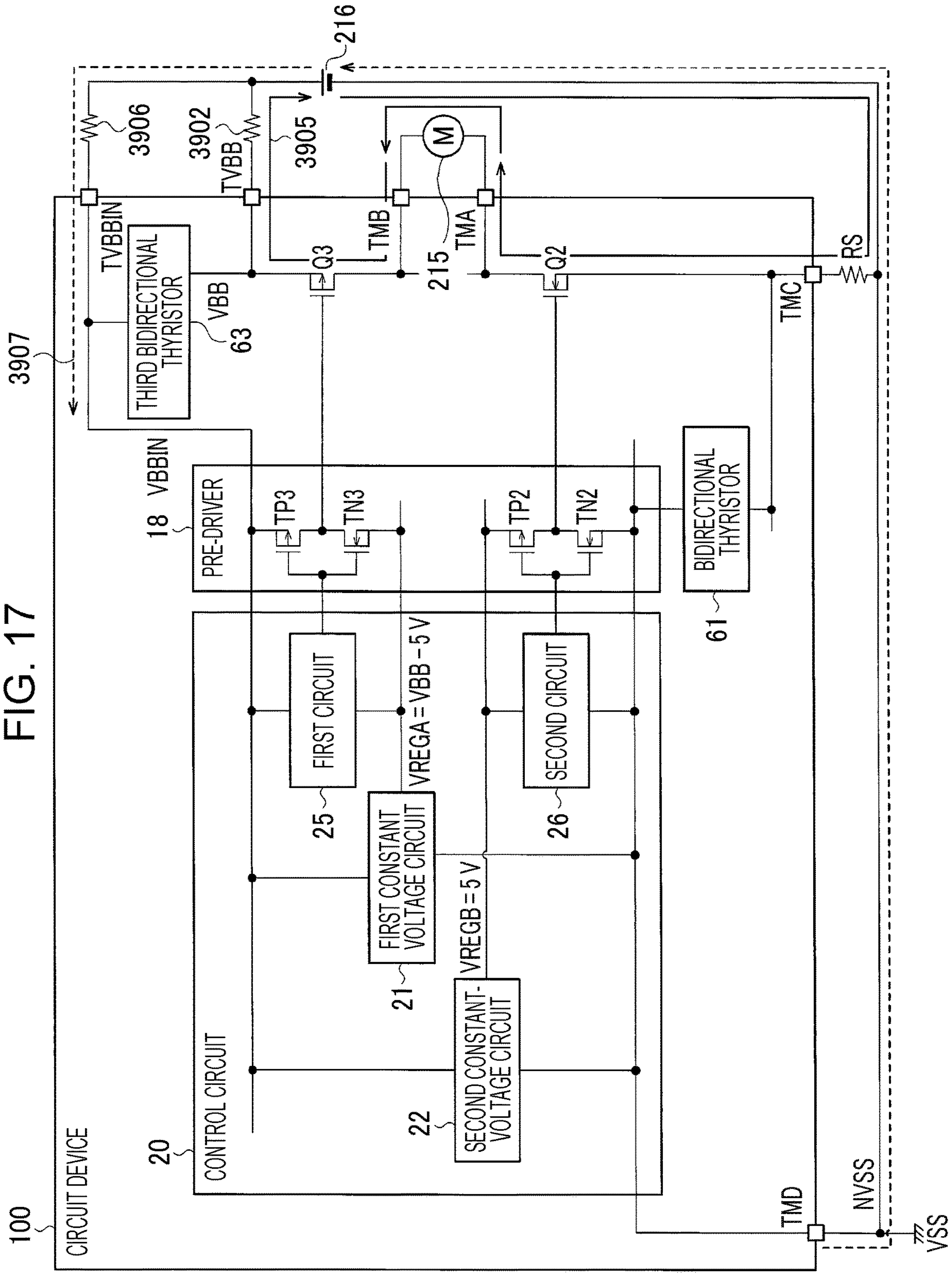
FIG. 17 shows a current path during a decay period of the third configuration example.

FIG. 16 shows a current path during the charging period of the third configuration example. FIG. 17 shows a current path during the decay period of the third configuration example. The detection circuit 30 is not shown in FIGS. 16 and 17. FIG. 16 shows components related to the charging period only and FIG. 17 shows components related to the decay period only.

A parasitic resistor 3906 is a parasitic resistor between the positive electrode terminal of the power source 216 and the power source lines of the control circuit 20 and the pre-driver 18. As represented by the arrows 3904 and 3905, a current flowing through the motor 215 in the charging period and the decay period passes through the parasitic resistor 3902 and does not pass through the parasitic resistor 3906. On the other hand, an arrow 3907 is a path through which the operating current of the control circuit 20 and the pre-driver 18 flows. The arrow 3907 extends through the parasitic resistor 3906 and does not extend through the parasitic resistor 3902. That is, the parasitic resistor 3902 is not a common impedance with respect to the power source lines of the control circuit 20 and the pre-driver 18.

Accordingly, the control circuit 20 and the pre-driver 18 are not influenced by noise of the power source voltage VBB caused by the bridge circuit, and thus malfunction of the motor driver 210 is prevented. The effect of using the third bidirectional thyristor 63 as the electrostatic protection circuit is the same as the effect of using the bidirectional thyristor 61.

In the present embodiment, the circuit device 100 includes the first low-potential-side power source terminal TMC, the second low-potential-side power source terminal TMD, the drive circuit 10, the switching control circuit 40, and the bidirectional thyristor 61 for electrostatic protection. The drive circuit 10 is coupled to the first low-potential-side power source terminal TMC and drives a drive target with a switching operation. The switching control circuit 40 is coupled to the second low-potential-side power source terminal TMD and controls the switching operation of the drive circuit 10. One end of the bidirectional thyristor 61 is coupled to the first low-potential-side power source terminal TMC and another end of the bidirectional thyristor 61 is coupled to the second low-potential-side power source terminal TMD.

The switching operation of the drive circuit 10 causes noise of the voltage VS at the first low-potential-side power source terminal TMC coupled to the drive circuit 10. According to the present embodiment, the switching control circuit 40 is coupled to the second low-potential-side power source terminal TMD. Accordingly, a ground node of the switching control circuit 40 is separated from the noise of the voltage VS at the first low-potential-side power source terminal TMC. In addition, since the bidirectional thyristor 61 is provided between the first low-potential-side power source terminal TMC and the second low-potential-side power source terminal TMD, an internal circuit can be protected from static electricity. There is a possibility that the noise of the voltage VS at the first low-potential-side power source terminal TMC propagates to the ground node of the switching control circuit 40 via the bidirectional thyristor 61. However, since the trigger voltage of the bidirectional thyristor 61 is higher than the clamping voltage of the bidirectional thyristor 61, propagation of the noise can be prevented. Since the clamping voltage is lower than the trigger voltage, it is possible to secure a high level of electrostatic resistance while preventing noise propagation.

In the present embodiment, the switching control circuit 40 includes the detection circuit 30 that detects a current flowing through the drive target and the control circuit 20 that controls the switching operation based on the result of detection performed by the detection circuit 30.

According to the present embodiment, the detection circuit 30 and the control circuit 20 are not influenced by noise of the voltage VS at the first low-potential-side power source terminal TMC. Therefore, erroneous current detection or switching operation control can be prevented. Accordingly, it is possible to prevent control of driving a drive target in a motor driver or the like from being erroneously performed.

In addition, in the present embodiment, the detection circuit 30 includes the comparison circuit 36 that compares the reference voltage VR with the voltage VS at the first low-potential-side power source terminal TMC.

According to the present embodiment, the comparison circuit 36 is not influenced by the noise of the voltage VS at the first low-potential-side power source terminal TMC. Therefore, erroneous voltage comparison can be prevented. Accordingly, it is possible to prevent control of driving a drive target in a motor driver or the like from being erroneously performed.

In addition, in the present embodiment, the drive circuit 10 includes the transistors Q1 to Q4 that drive the drive target. The control circuit 20 outputs, based on the result of the detection performed by the detection circuit 30, a control signal to control the switching operation of the transistors Q1 to Q4. The switching control circuit 40 includes the pre-driver 18 that drives gates of the transistors Q1 to Q4 based on the control signal.

According to the present embodiment, the pre-driver 18 is not influenced by the noise of the voltage VS at the first low-potential-side power source terminal TMC. Therefore, the transistors can be prevented from being erroneously driven by the pre-driver 18. Accordingly, it is possible to prevent control of driving a drive target in a motor driver or the like from being erroneously performed.

In addition, in the present embodiment, the circuit device 100 may include the third low-potential-side power source terminal TMCS and the second bidirectional thyristor 62 for electrostatic protection. One end of the second bidirectional thyristor 62 may be coupled to the third low-potential-side power source terminal TMCS, and another end of the second bidirectional thyristor 62 may be coupled to the second low-potential-side power source terminal TMD. The detection circuit 30 may include the comparison circuit 36 that compares the reference voltage VR with the voltage VS at the third low-potential-side power source terminal TMCS.

The switching operation of the drive circuit 10 may cause noise of the voltage VS at the first low-potential-side power source terminal TMC coupled to the drive circuit 10. According to the present embodiment, the comparison circuit 36 compares the reference voltage VR with the voltage VS at the third low-potential-side power source terminal TMCS. Accordingly, the voltage VS input to the comparison circuit 36 is separated from the noise of a voltage at the first low-potential-side power source terminal TMC. In addition, since the second bidirectional thyristor 62 is provided between the third low-potential-side power source terminal TMCS and the second low-potential-side power source terminal TMD, an internal circuit can be protected from static electricity. There is a possibility that the noise of the voltage at the first low-potential-side power source terminal TMC propagates to the voltage VS input to the comparison circuit 36 via the second bidirectional thyristor 62. According to the present embodiment, since the trigger voltage of the second bidirectional cell 62 is higher than the clamping voltage of the second bidirectional thyristor 62, it is possible to prevent noise propagation. Since the clamping voltage is lower than the trigger voltage, it is possible to secure a high level of electrostatic resistance while preventing noise propagation.

In addition, in the present embodiment, the circuit device 100 may include the first high-potential-side power source terminal TVBB, the second high-potential-side power source terminal TVBBIN, and the third bidirectional thyristor 63. One end of the third bidirectional thyristor 63 may be coupled to the first high-potential-side power source terminal TVBB, and another end of the third bidirectional thyristor 63 may be coupled to the second high-potential-side power source terminal TVBBIN. The drive circuit 10 may be coupled to the first high-potential-side power source terminal TVBB. The switching control circuit 40 may be coupled to the second high-potential-side power source terminal TVBBIN.

The switching operation of the drive circuit 10 causes noise of the voltage VBB at the first high-potential-side power source terminal TVBB coupled to the drive circuit 10. According to the present embodiment, the switching control circuit 40 is coupled to the second high-potential-side power source terminal TVBBIN. Accordingly, a power source node of the switching control circuit 40 is separated from the noise of the voltage VBB of the first high-potential-side power source terminal TVBB. In addition, since the third bidirectional thyristor 63 is provided between the first high-potential-side power source terminal TVBB and the second high-potential-side power source terminal TVBBIN, the internal circuit can be protected from static electricity. There is a possibility that the noise of the voltage VBB at the first high-potential-side power source terminal TVBB propagates to the power source node of the switching control circuit 40 via the third bidirectional thyristor 63. However, since the trigger voltage of the third bidirectional thyristor 63 is higher than the clamping voltage of the third bidirectional thyristor 63, propagation of the noise can be prevented. Since the clamping voltage is lower than the trigger voltage, it is possible to secure a high level of electrostatic resistance while preventing noise propagation.

In addition, in the present embodiment, the drive target may be a motor, a coil, or a solenoid. An example in which the drive target is a coil or a solenoid will be described later.

In addition, the bidirectional thyristor 61 of the present embodiment may be the bidirectional thyristor 1 of FIGS. 7 to 9. The bidirectional thyristor 1 includes the first anode region 402, the first cathode region 403, the first impurity region 503, the first gate region 404, the second anode region 407, the second cathode region 408, the second impurity region 505, the second gate region 409, and the third gate region 401. The first anode region 402 is an impurity region that is provided at the first well 601 having a first conductivity type, that is electrically coupled to the anode line Lm, and that has a second conductivity type. The first cathode region 403 is an impurity region that is provided at the second well 602 having the second conductivity type, that is electrically coupled to the first low-potential-side power source terminal TMC, and that has the first conductivity type. The first impurity region 503 is an impurity region that is provided at the second well 602, that is electrically coupled to the anode line Lm via the second resistor element Rexc, and that has the first conductivity type. The first gate region 404 is an impurity region that is provided at the second well 602, that is electrically coupled to the first cathode line L1 via the first resistor element Rexa, and that has the second conductivity type. The second anode region 407 is an impurity region that is provided at the first well 601 having the first conductivity type, that is electrically coupled to the anode line Lm, and that has the second conductivity type. The second cathode region 408 is an impurity region that is provided at the third well 603 having the second conductivity type, that is electrically coupled to the second low-potential-side power source terminal TMD, and that has the first conductivity type. The second impurity region 505 is an impurity region that is provided at the third well 603, that is electrically coupled to the anode line Lm via the second resistor element Rexc, and that has the first conductivity type. The second gate region 409 is an impurity region that is provided at the third well 603, that is electrically coupled to the second cathode line L2 via the third resistor element Rexb, and that has the second conductivity type. The third gate region 401 is an impurity region that is provided at the first well 601, that is electrically coupled to the anode line Lm via the second resistor element Rexc, and that has the first conductivity type.

As described with reference to FIGS. 7 to 9, according to the above-described bidirectional thyristor 1, since there is no other impurity region provided between the first anode region 402 and the first cathode region 403, the distance 431 between the first anode region 402 and the first cathode region 403 is short. In addition, there is no other impurity region provided between the second anode region 407 and the second cathode region 408, the distance 432 between the second anode region 407 and the second cathode region 408 is short. Accordingly, parasitic resistance between the anode regions and the cathode regions is small, and thus the holding voltage of the bidirectional thyristor 1 can be lowered. Accordingly, the clamping voltage of the bidirectional thyristor 1 can be lowered.

2. Switching Regulator

Hereinafter, an example in which the circuit device of the present embodiment is applied to a switching regulator will be described. The drive target is a coil.

Figure 18:
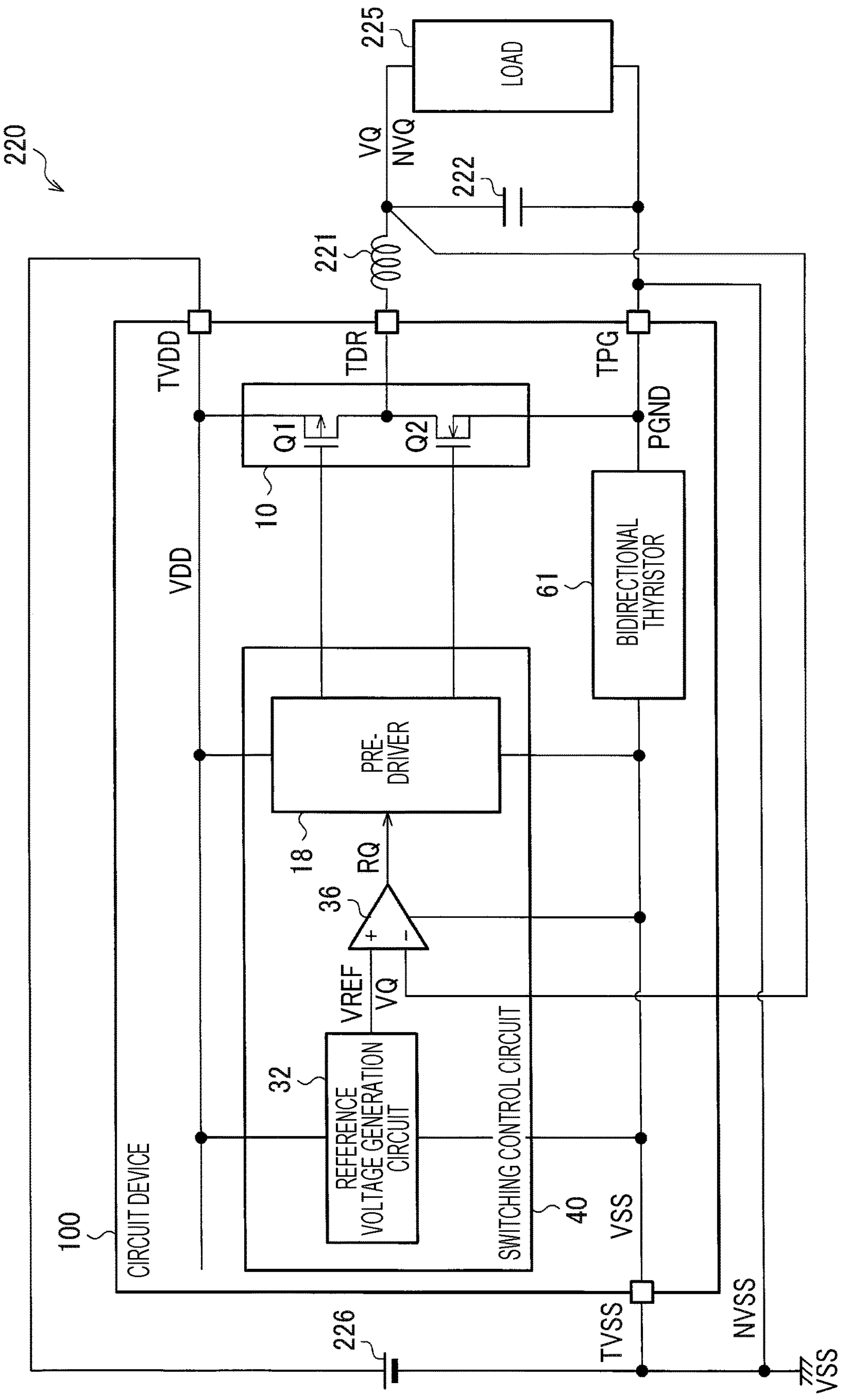
FIG. 18 shows a configuration example of a synchronous rectification step-down type switching regulator and a fourth configuration example of the circuit device.

FIG. 18 is a configuration example of a synchronous rectification step-down type switching regulator and a fourth configuration example of the circuit device. A switching regulator 220 includes the circuit device 100, a coil 221, and a capacitor 222. The coil 221 may be referred to as an inductor.

A load 225 is a target to which the output voltage of the switching regulator 220 is supplied. For example, the load 225 is a circuit that operates with the output voltage of the switching regulator 220 serving as a power source. A power source 226 generates a power source voltage VDD which is the input voltage of the switching regulator 220.

The circuit device 100 includes the drive circuit 10, the switching control circuit 40, the bidirectional thyristor 61, a drive terminal TDR, a first low-potential-side power source terminal TPG, a second low-potential-side power source terminal TVSS, and a first high-potential-side power source terminal TVDD.

The drive terminal TDR is coupled to one end of the coil 221. Another end of the coil 221 is coupled to an output node NVQ of the switching regulator 220. The first low-potential-side power source terminal TPG is coupled to the ground node NVSS. One end of the capacitor 222 is coupled to the output node NVQ, and another end of the capacitor 222 is coupled to the ground node NVSS. The load 225 is coupled between the output node NVQ and the ground node NVSS. The first high-potential-side power source terminal TVDD is coupled to a positive electrode terminal of the power source 226. The second low-potential-side power source terminal TVSS is coupled to a negative electrode terminal of the power source 226 and to the ground node NVSS.

The switching control circuit 40 controls a switching operation of the drive circuit 10 based on a voltage VQ at the output node NVQ. The switching control circuit 40 includes the reference voltage generation circuit 32, the comparison circuit 36, and the pre-driver 18.

The reference voltage generation circuit 32 generates a reference voltage VREF. The reference voltage generation circuit 32 includes, for example, a bandgap reference circuit and a voltage dividing circuit that generates the reference voltage VREF based on an output voltage of the bandgap reference circuit.

The comparison circuit 36 compares the reference voltage VREF with the voltage VQ, and outputs the result of the comparison as the detection result signal RQ. In an example shown in FIG. 18, the signal RQ is at a high level when VQ<VREF, and the signal RQ is at a low level when VQ>VREF.

The pre-driver 18 outputs, based on the detection result signal RQ, a pre-drive signal that drives a gate of each transistor of the drive circuit 10. The pre-driver 18 includes, for example, a control circuit and a buffer circuit. The control circuit outputs, based on the detection result signal RQ, a control signal to control each transistor of the drive circuit 10 to be turned on or off. The buffer circuit outputs the pre-drive signal that drives the gate of each transistor of the drive circuit 10 by buffering the control signal.

Ground lines of the reference voltage generation circuit 32, the comparison circuit 36, and the pre-driver 18 are coupled to the second low-potential-side power source terminal TVSS.

The drive circuit 10 drives the coil 221 based on the pre-drive signal. The drive circuit 10 includes the transistors Q1 and Q2.

The transistor Q1 is a P-type MOS transistor. A source of the transistor Q1 is coupled to the first high-potential-side power source terminal TVDD, and a drain of the transistor Q1 is coupled to the drive terminal TDR. The transistor Q2 is an N-type MOS transistor. A source of the transistor Q2 is coupled to the first low-potential-side power source terminal TPG, and a drain of the transistor Q2 is coupled to the drive terminal TDR.

In the first period, the pre-driver 18 turns on the transistor Q1 and turns off the transistor Q2. In the second period, the pre-driver 18 turns on the transistor Q2 and turns off the transistor Q1. The switching control circuit 40 repeats the first period and the second period based on the result of comparison between the output voltage VQ at the switching regulator 220 and the reference voltage VREF. Accordingly, control is performed such that the output voltage VQ becomes a voltage corresponding to the reference voltage VREF.

The bidirectional thyristor 61 is an electrostatic protection circuit between the first low-potential-side power source terminal TPG and the second low-potential-side power source terminal TVSS. One end of the bidirectional thyristor 61 is coupled to the first low-potential-side power source terminal TPG, and another end is coupled to the second low-potential-side power source terminal TVSS. For example, it will be assumed that static electricity is applied to the first low-potential-side power source terminal TPG with the second low-potential-side power source terminal TVSS serving as a ground. A discharge path at the time of application of positive static electricity is a path from the first low-potential-side power source terminal TPG to the bidirectional thyristor 61 and the second low-potential-side power source terminal TVSS and a discharge path at the time of application of negative static electricity is a path from the second low-potential-side power source terminal TVSS to the bidirectional thyristor 61 and the first low-potential-side power source terminal TPG. A noise prevention effect and the like of the bidirectional thyristor 61 will be described later with reference to FIG. 20.

Figure 19:
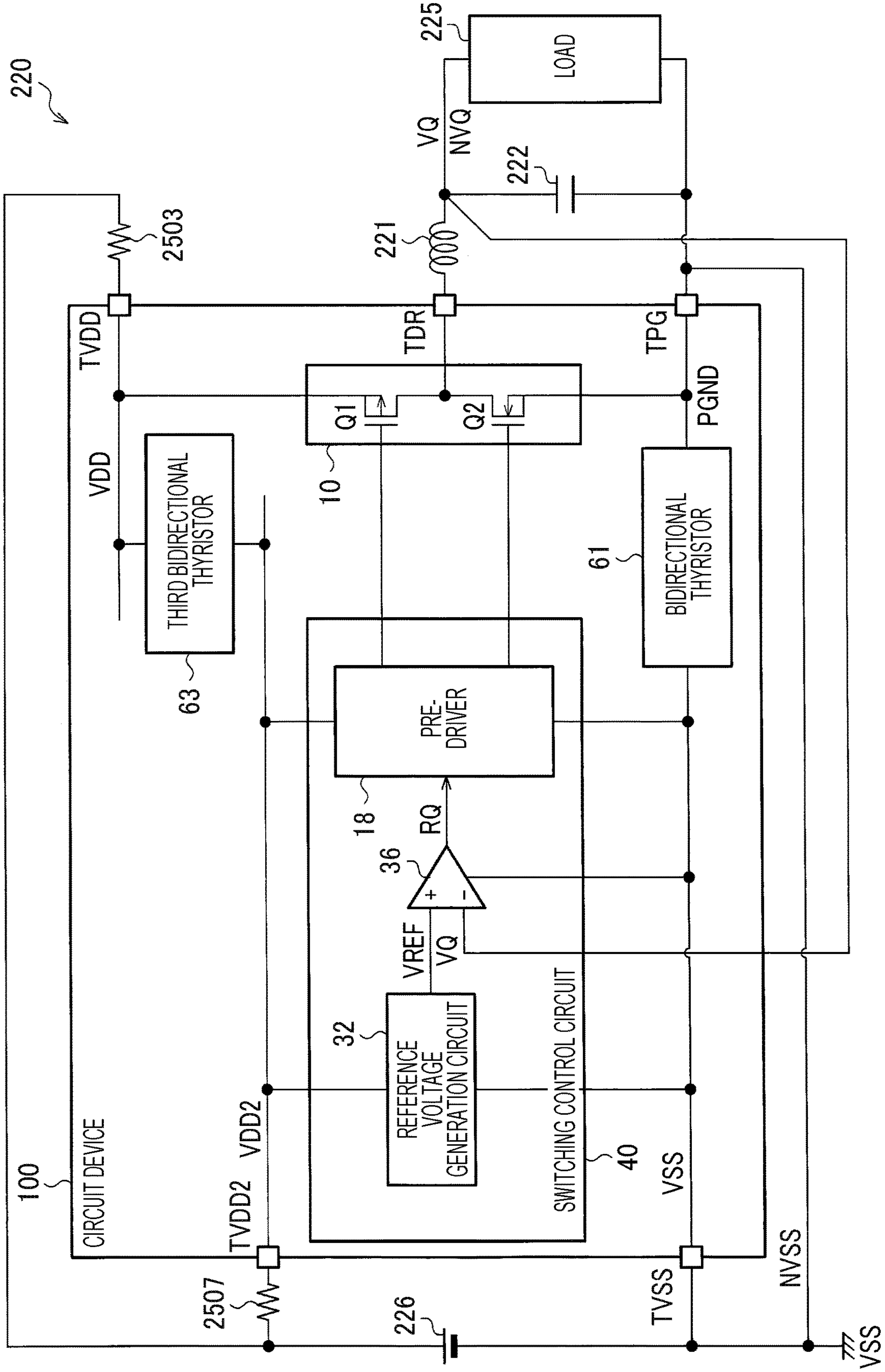
FIG. 19 shows a fifth configuration example of the circuit device.

FIG. 19 is a fifth configuration example of the circuit device. In the case of the fifth configuration example, the circuit device 100 further includes, with respect to the fourth configuration example, the third bidirectional thyristor 63 and a second high-potential-side power source terminal TVDD2. The operation of the switching regulator 220 is the same as that in FIG. 18.

The second high-potential-side power source terminal TVDD2 is coupled to the positive electrode terminal of the power source 226. Power source lines of the reference voltage generation circuit 32 and the pre-driver 18 are coupled to the second high-potential-side power source terminal TVDD2. Power source voltages at the reference voltage generation circuit 32 and the pre-driver 18 are a power source voltage VDD2 supplied from the second high-potential-side power source terminal TVDD2.

The coupling and discharge path of the bidirectional thyristor 61 is as described with reference to FIG. 18.

The third bidirectional thyristor 63 is an electrostatic protection circuit between the first high-potential-side power source terminal TVDD and the second high-potential-side power source terminal TVDD2. One end of the third bidirectional thyristor 63 is coupled to the first high-potential-side power source terminal TVDD, and another end of the third bidirectional thyristor 63 is coupled to the second high-potential-side power source terminal TVDD2. For example, it will be assumed that static electricity is applied to the first high-potential-side power source terminal TVDD with the second high-potential-side power source terminal TVDD2 serving as a ground. A discharge path at the time of application of positive static electricity is a path from the first high-potential-side power source terminal TVDD to the third bidirectional thyristor 63 and the second high-potential-side power source terminal TVDD2 and a discharge path at the time of application of negative static electricity is a path from the second high-potential-side power source terminal TVDD2 to the third bidirectional thyristor 63 and the first high-potential-side power source terminal TVDD.

Note that a parasitic resistor 2503 is a parasitic resistor between the positive electrode terminal of the power source 226 and the source of the transistor Q1. A parasitic resistor 2507 is a parasitic resistor between the positive electrode terminal of the power source 226 and the power source lines of the reference voltage generation circuit 32 and the pre-driver 18. Although not shown, there is a parasitic resistor between the ground node NVSS and the ground line of the switching control circuit 40. In addition, there is a parasitic resistor between the ground node NVSS and the source of the transistor Q2.

Figure 20:
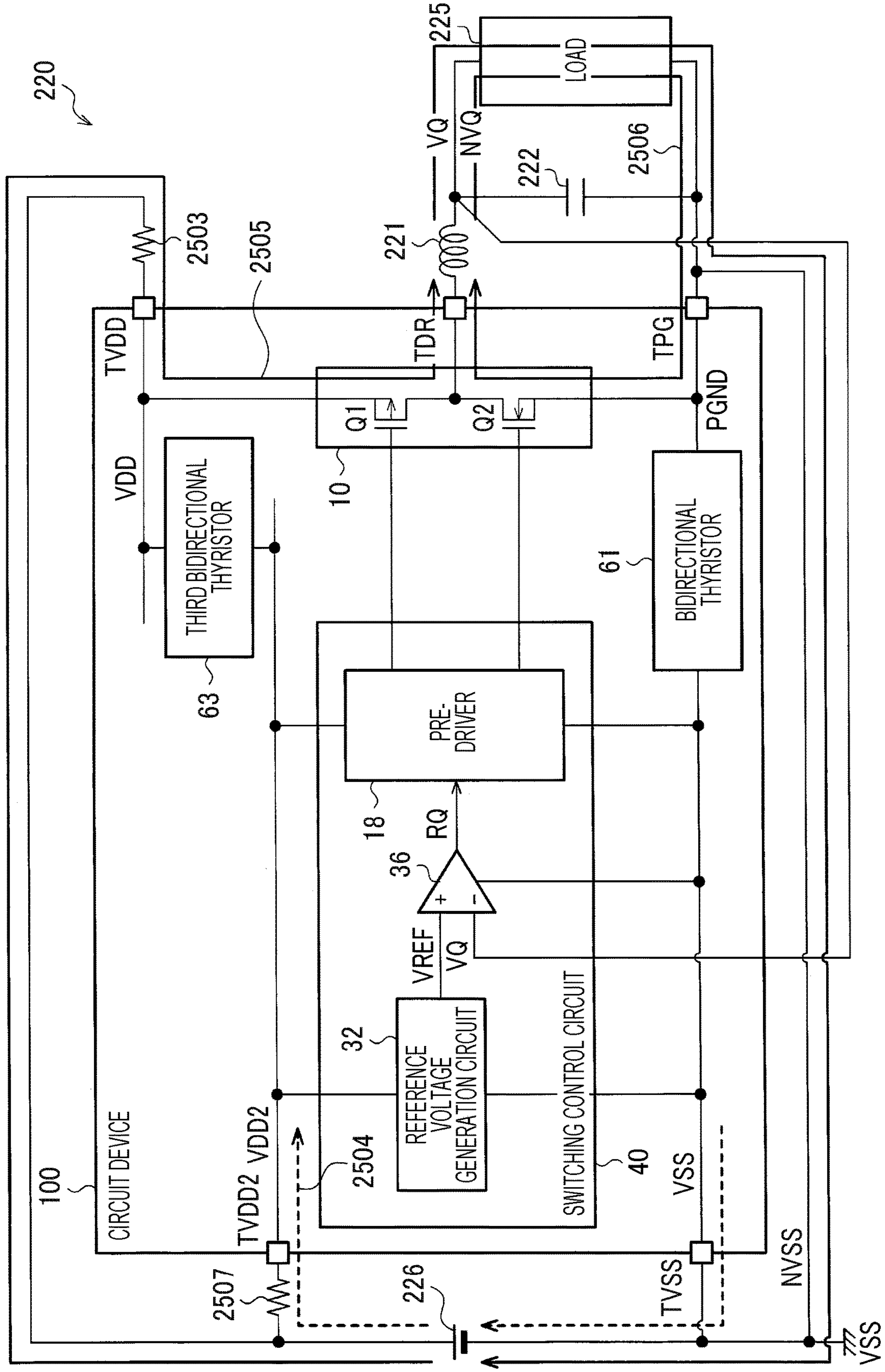
FIG. 20 shows current paths during a first period and a second period of the fifth configuration example.

In FIG. 20, current paths in the first period and the second period of the fifth configuration example are shown.

An arrow 2505 represents the current path in the first period. Magnetic energy is accumulated in the coil 221 due to the current. When the voltage VS becomes higher than the reference voltage VREF, the second period is started. An arrow 2506 represents the current path in the second period. The magnetic energy accumulated in the coil 221 is output to the load 225 in the form of a current.

As represented by the arrow 2505, in the first period, the power source voltage VDD input from the first high-potential-side power source terminal TVDD is made lower than the positive electrode voltage of the power source 226 due to the influence of the parasitic resistor 2503. Since the transistor Q1 is off in the second period, the power source voltage VDD is substantially the same as the positive electrode voltage of the power source 226. That is, regarding the drive circuit 10, noise of the power source voltage VDD in the circuit device 100 is caused due to a surge current in a normal operation of the switching regulator 220.

An arrow 2504 is a path through which an operating current of the reference voltage generation circuit 32 and the pre-driver 18 flows and the arrow 2504 extends through the parasitic resistor 2507 and does not extend through the parasitic resistor 2503. That is, the parasitic resistor 2503 is not a common impedance with respect to the power source lines of the reference voltage generation circuit 32 and the pre-driver 18.

Accordingly, the power source voltage VDD2 of the reference voltage generation circuit 32 and the pre-driver 18 is not influenced by noise of the power source voltage VDD caused by the drive circuit 10, and thus malfunction of the switching regulator 220 is prevented. The effect of using the third bidirectional thyristor 63 as the electrostatic protection circuit is as described with reference to FIG. 6 and the like.

As represented by the arrow 2506, in the second period, a ground voltage PGND input from the first low-potential-side power source terminal TPG becomes a negative voltage lower than the ground voltage VSS due to the influence of parasitic resistance. The transistor Q2 is off in the first period. A current represented by the arrow 2505 flows to the ground node NVSS outside the circuit device 100. At this time, due to the influence of the parasitic resistance of the ground node NVSS, the ground voltage PGND becomes a voltage higher than the ground voltage VSS. In addition, at the time of a switch from the first period to the second period, the amount of a current flowing through the ground node NVSS rapidly decreases, and thus undershoot in ground voltage PGND occurs. As described above, regarding the drive circuit 10, noise of the ground voltage PGND in the circuit device 100 is caused due to a surge current in a normal operation of the switching regulator 220.

As represented by the arrow 2504, the operating current of the reference voltage generation circuit 32 and the pre-driver 18 passes through the second low-potential-side power source terminal TVSS and does not pass through the first low-potential-side power source terminal TPG. That is, a parasitic resistor related to the first low-potential-side power source terminal TPG is not a common impedance with respect to the ground lines of the reference voltage generation circuit 32 and the pre-driver 18.

Accordingly, the reference voltage generation circuit 32 and the pre-driver 18 are not influenced by noise of the ground voltage PGND caused by the drive circuit 10, and thus malfunction of the switching regulator 220 is prevented. The effect of using the bidirectional thyristor 61 as the electrostatic protection circuit is as described with reference to FIG. 6 and the like.

Note that in the configuration example of FIG. 18 also, the malfunction of the switching regulator 220 is prevented and the effect described with reference to FIG. 6 and the like is achieved since the bidirectional thyristor 61 is provided.

Figure 21:
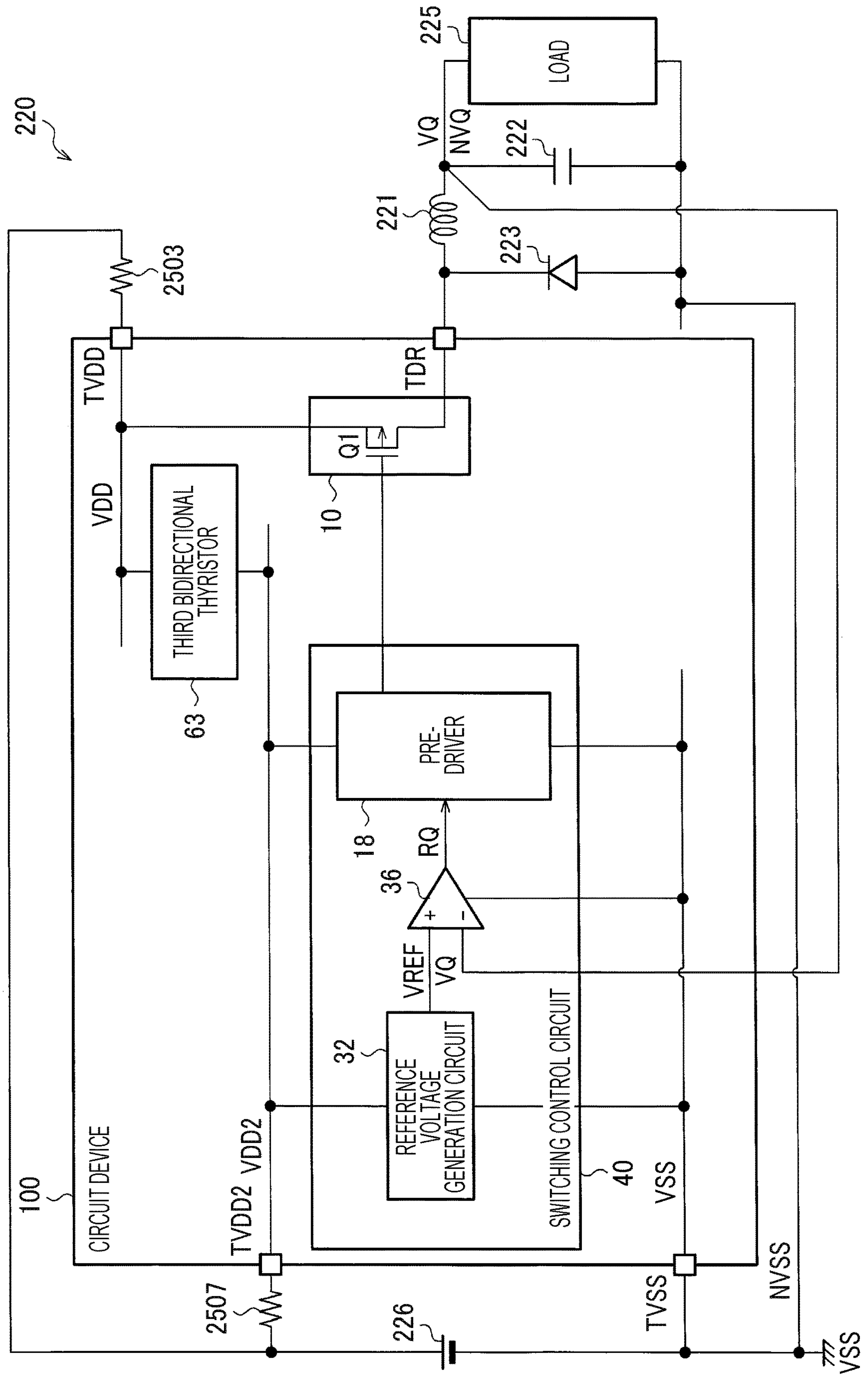
FIG. 21 shows a configuration example of an asynchronous rectification step-down type switching regulator and a sixth configuration example of the circuit device.

FIG. 21 is a configuration example of an asynchronous rectification step-down type switching regulator and a sixth configuration example of the circuit device. The switching regulator 220 includes the circuit device 100, the coil 221, the capacitor 222, and a diode 223. The circuit device 100 includes the drive circuit 10, the switching control circuit 40, the third bidirectional thyristor 63, the drive terminal TDR, the second low-potential-side power source terminal TVSS, the first high-potential-side power source terminal TVDD, and the second high-potential-side power source terminal TVDD2.

The drive circuit 10 includes the transistor Q1. A cathode of the diode 223 is coupled to the drive terminal TDR, and an anode of the diode 223 is coupled to the ground node NVSS.

In the first period, the transistor Q1 is on and magnetic energy is accumulated in the coil 221. In the second period, the transistor Q1 is off. The magnetic energy accumulated in the coil 221 is output to the load 225 in the form of a current. This current is regenerated through the diode 223.

Similar to FIG. 20, the third bidirectional thyristor 63 prevents noise propagation. In addition, the function of the third bidirectional thyristor 63 as an electrostatic protection circuit is as described with reference to FIG. 6 and the like.

Figure 22:
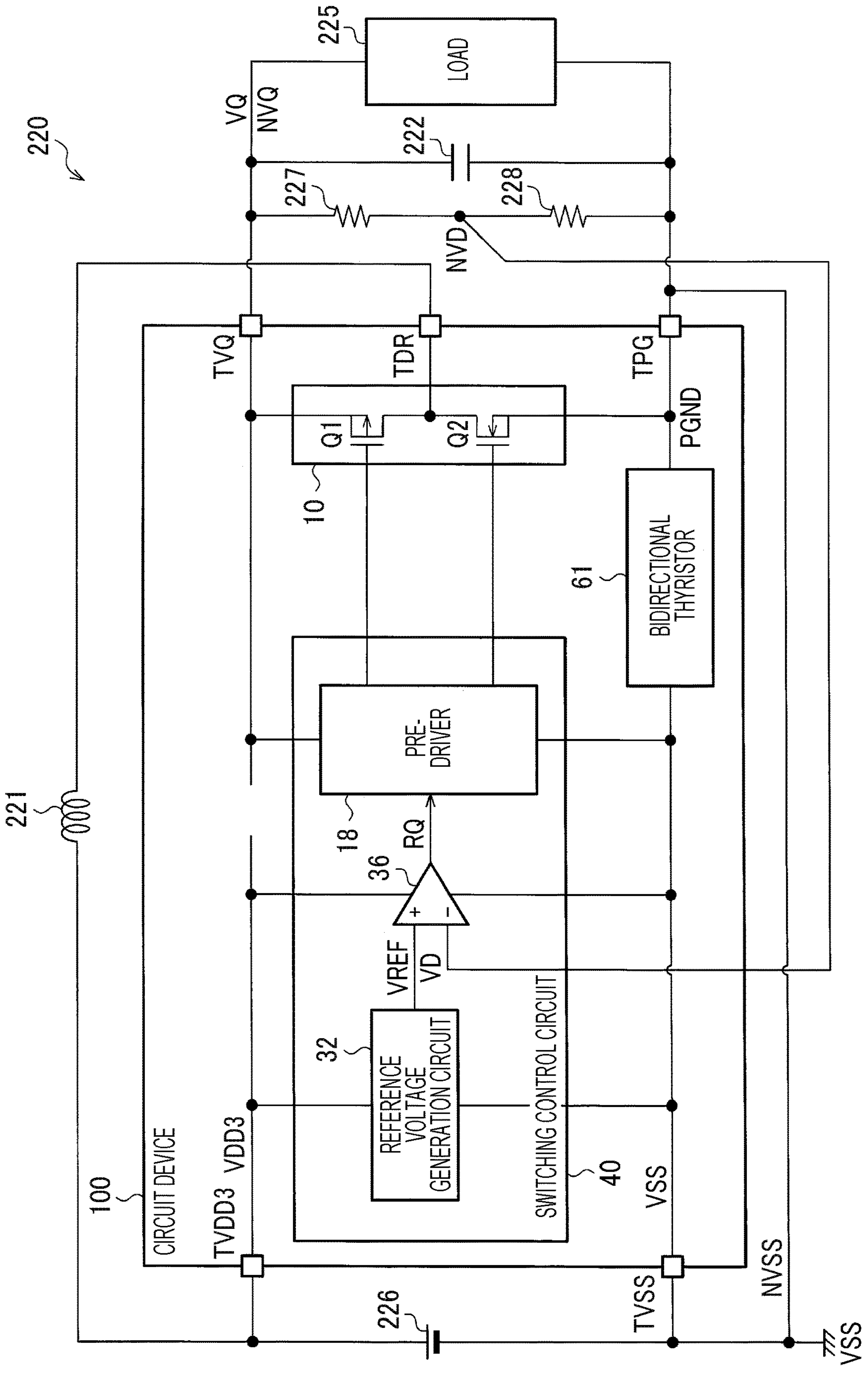
FIG. 22 shows a configuration example of a synchronous rectification step-up type switching regulator and a seventh configuration example of the circuit device.

FIG. 22 is a configuration example of a synchronous rectification step-up type switching regulator and a seventh configuration example of the circuit device. The switching regulator 220 includes the circuit device 100, the coil 221, the capacitor 222, a resistor 227, and a resistor 228. The circuit device 100 includes the drive circuit 10, the switching control circuit 40, the bidirectional thyristor 61, the drive terminal TDR, the first low-potential-side power source terminal TPG, the second low-potential-side power source terminal TVSS, a first high-potential-side power source terminal TVQ, and a third high-potential-side power source terminal TVDD3.

One end of the capacitor 222 is coupled to the first high-potential-side power source terminal TVQ, and another end of the capacitor 222 is coupled to the ground node NVSS. One end of the resistor 227 is coupled to the first high-potential-side power source terminal TVQ, and another end of the resistor 227 is coupled to a node NVD. One end of the resistor 228 is coupled to the node NVD, and another end of the resistor 228 is coupled to the ground node NVSS. One end of the coil 221 is coupled to the drive terminal TDR, and another end of the coil 221 is coupled to the positive electrode terminal of the power source 226. The third high-potential-side power source terminal TVDD3 is coupled to the positive electrode terminal of the power source 226.

Power source nodes of the reference voltage generation circuit 32 and the comparison circuit 36 are coupled to the third high-potential-side power source terminal TVDD3, and the power source voltage VDD3 is supplied thereto. The comparison circuit 36 compares a voltage VD at the node NVD with the reference voltage VREF. A power source node of the pre-driver 18 is coupled to the first high-potential-side power source terminal TVQ, and the output voltage VQ of the switching regulator 220 is supplied thereto as a power source voltage. Ground nodes of the reference voltage generation circuit 32, the comparison circuit 36, and the pre-driver 18 are coupled to the second low-potential-side power source terminal TVSS.

The drive circuit 10 includes the transistors Q1 and Q2. The transistor Q1 is a P-type MOS transistor. A source of the transistor Q1 is coupled to the first high-potential-side power source terminal TVQ, and a drain of the transistor Q1 is coupled to the drive terminal TDR. The transistor Q2 is an N-type MOS transistor. A source of the transistor Q2 is coupled to the first low-potential-side power source terminal TPG, and a drain of the transistor Q2 is coupled to the drive terminal TDR.

In the first period, the pre-driver 18 turns on the transistor Q2 and turns off the transistor Q1. In the second period, the pre-driver 18 turns on the transistor Q1 and turns off the transistor Q2. The output voltage VQ is divided into the voltage VD by the resistor 227 and the resistor 228. The switching control circuit 40 repeats the first period and the second period based on the result of comparison between the voltage VD and the reference voltage VREF. Accordingly, control is performed such that the voltage VD becomes a voltage corresponding to the reference voltage VREF. The division ratio and the reference voltage VREF are set such that the output voltage VQ is higher than the positive electrode voltage of the power source 226.

The noise prevention effect and the like of the bidirectional thyristor 61 will be described later with reference to FIG. 24.

Figure 23:
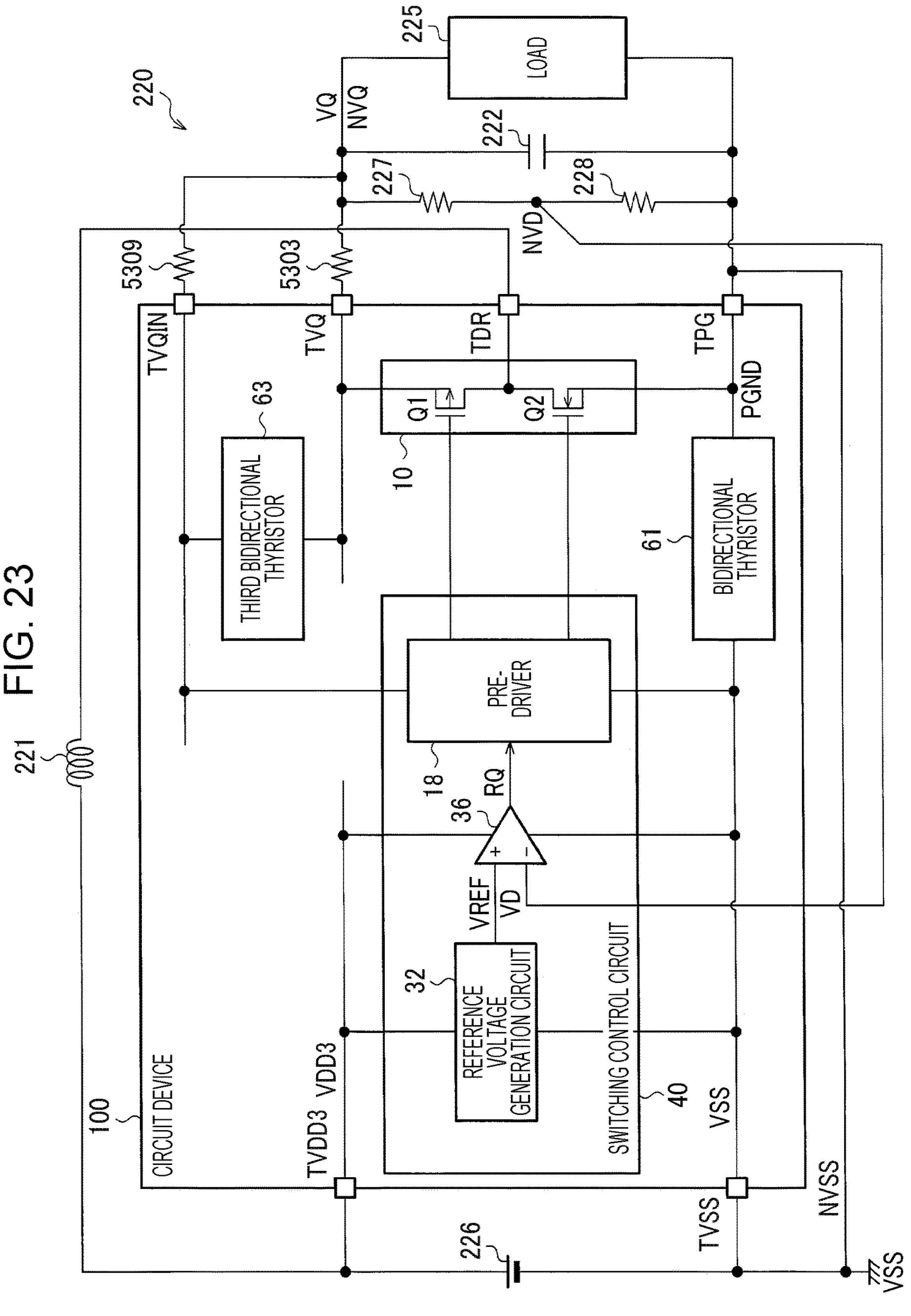
FIG. 23 shows an eighth configuration example of the circuit device.

FIG. 23 is an eighth configuration example of the circuit device. In the case of the eighth configuration example, the circuit device 100 includes, with respect to the seventh configuration example, the third bidirectional thyristor 63 and a second high-potential-side power source terminal TVQIN. The operation of the switching regulator 220 is the same as that in FIG. 22.

The second high-potential-side power source terminal TVQIN is coupled to a node of the output voltage VQ. The power source line of the pre-driver 18 is coupled to the second high-potential-side power source terminal TVQIN. The power source voltage of the pre-driver 18 is the output voltage VQ supplied from the second high-potential-side power source terminal TVQIN.

The third bidirectional thyristor 63 is an electrostatic protection circuit between the first high-potential-side power source terminal TVQ and the second high-potential-side power source terminal TVQIN. One end of the third bidirectional thyristor 63 is coupled to the first high-potential-side power source terminal TVQ, and another end of the third bidirectional thyristor 63 is coupled to the second high-potential-side power source terminal TVQIN.

A parasitic resistor 5303 is a parasitic resistor between the output node NVQ of the switching regulator 220 and the source of the transistor Q1. A parasitic resistor 5309 is a parasitic resistor between the output node NVQ and the power source line of the pre-driver 18. Although not shown, there is a parasitic resistor between the ground node NVSS and the ground line of the switching control circuit 40. In addition, there is a parasitic resistor between the ground node NVSS and the source of the transistor Q2.

Figure 24:
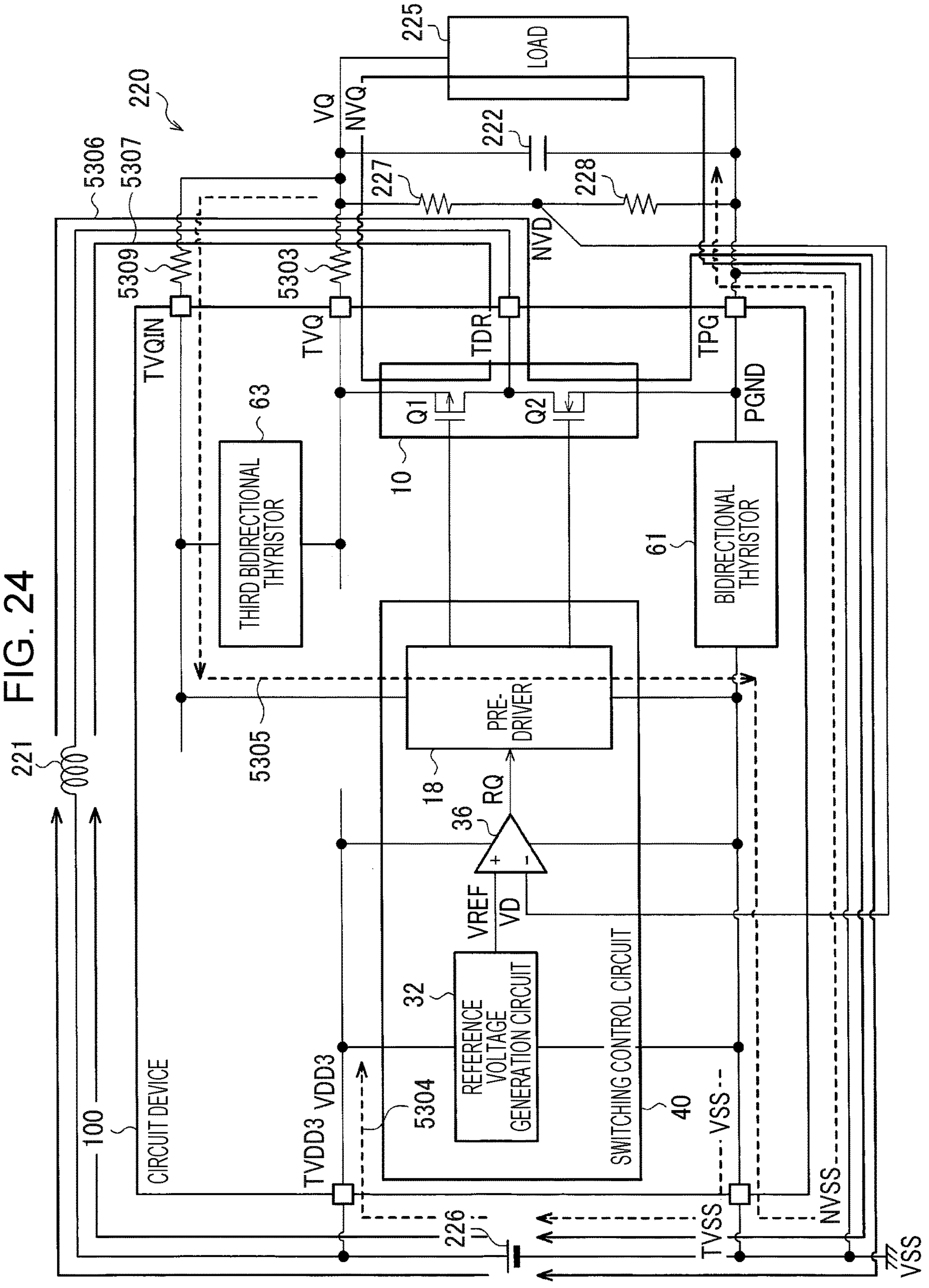
FIG. 24 shows current paths during the first period and the second period of the eighth configuration example.

In FIG. 24, current paths in the first period and the second period of the eighth configuration example are shown.

An arrow 5306 represents the current path in the first period. Magnetic energy is accumulated in the coil 221 due to the current. When the voltage VD becomes higher than the reference voltage VREF, the second period is started. An arrow 5307 represents the current path in the second period. The magnetic energy accumulated in the coil 221 is output to the load 225 in the form of a current.

As represented by the arrow 5307, in the second period, the source voltage of the transistor Q1 is made higher than the output voltage VQ supplied to the load 225 due to the influence of the parasitic resistor 5303. Since the transistor Q1 is off in the first period, the source voltage of the transistor Q1 is substantially the same as the output voltage VQ. That is, regarding the drive circuit 10, noise of the source voltage of the transistor Q1 is caused due to a surge current in a normal operation of the switching regulator 220.

An arrow 5304 is a path through which the operating current of the reference voltage generation circuit 32 and the comparison circuit 36 flows and the arrow 5304 does not extend through the parasitic resistor 5303. That is, the parasitic resistor 5303 is not a common impedance with respect to the power source lines of the reference voltage generation circuit 32 and the comparison circuit 36. In addition, an arrow 5305 is a path through which the operating current of the pre-driver 18 flows. The arrow 5305 extends through the parasitic resistor 5309 and does not extend through the parasitic resistor 5303. That is, the parasitic resistor 5303 is not a common impedance with respect to the power source line of the pre-driver 18.

Accordingly, the power source voltage of the reference voltage generation circuit 32, the comparison circuit 36, and the pre-driver 18 is not influenced by noise of the source voltage of the transistor Q1 that is caused by the drive circuit 10, and thus malfunction of the switching regulator 220 is prevented. The effect of using the third bidirectional thyristor 63 as the electrostatic protection circuit is as described with reference to FIG. 6 and the like.

As represented by the arrow 5307, in the second period, the ground voltage PGND, which is the source voltage of the transistor Q2, becomes a voltage higher than the ground voltage VSS due to the influence of a parasitic resistor. As described above, regarding the drive circuit 10, noise of the ground voltage PGND in the circuit device 100 is caused due to a surge current in a normal operation of the switching regulator 220.

As represented by the arrow 5304, the operating current of the reference voltage generation circuit 32 and the comparison circuit 36 passes through the second low-potential-side power source terminal TVSS and does not pass through the first low-potential-side power source terminal TPG. In addition, as represented by the arrow 5305, the operating current of the pre-driver 18 passes through the second low-potential-side power source terminal TVSS and does not pass through the first low-potential-side power source terminal TPG. That is, a parasitic resistor related to the first low-potential-side power source terminal TPG is not a common impedance with respect to the ground lines of the reference voltage generation circuit 32, the comparison circuit 36, and the pre-driver 18.

Accordingly, the reference voltage generation circuit 32, the comparison circuit 36, and the pre-driver 18 are not influenced by noise of the ground voltage PGND caused by the drive circuit 10, and thus malfunction of the switching regulator 220 is prevented. The effect of using the bidirectional thyristor 61 as the electrostatic protection circuit is as described with reference to FIG. 6 and the like.

Note that in the configuration example of FIG. 22 also, the malfunction of the switching regulator 220 is prevented and the effect described with reference to FIG. 6 and the like is achieved since the bidirectional thyristor 61 is provided.

Figure 25:
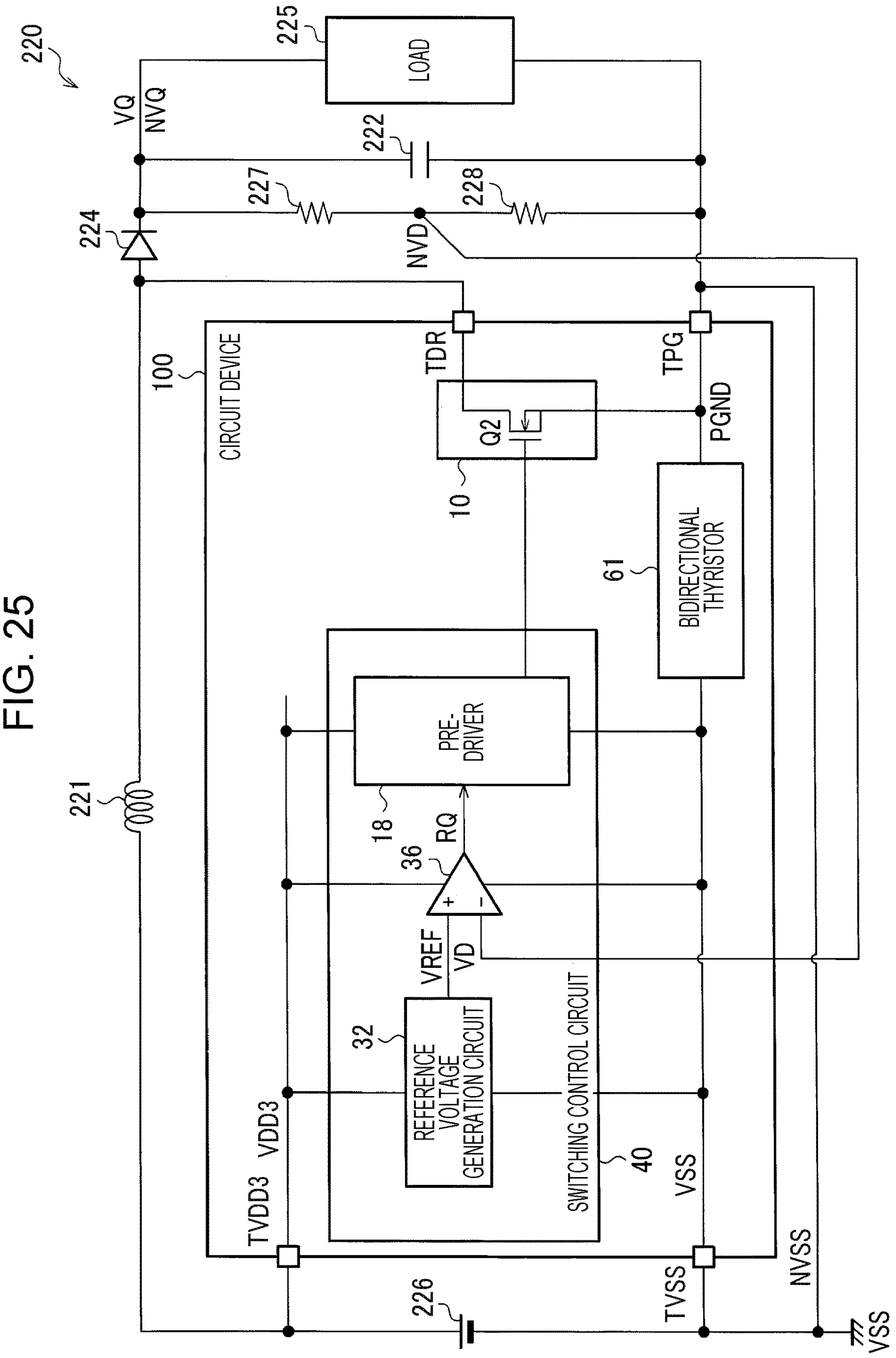
FIG. 25 shows a configuration example of an asynchronous rectification step-up type switching regulator and a ninth configuration example of the circuit device.

FIG. 25 is a configuration example of an asynchronous rectification step-up type switching regulator and a ninth configuration example of the circuit device. The switching regulator 220 includes the circuit device 100, the coil 221, the capacitor 222, the resistor 227, the resistor 228, and a diode 224. The circuit device 100 includes the drive circuit 10, the switching control circuit 40, the bidirectional thyristor 61, the drive terminal TDR, the first low-potential-side power source terminal TPG, the second low-potential-side power source terminal TVSS, and the third high-potential-side power source terminal TVDD3.

The drive circuit 10 includes the transistor Q2. A cathode of the diode 224 is coupled to the output node NVQ, and an anode of the diode 224 is coupled to the drive terminal TDR.

In the first period, the transistor Q2 is on and magnetic energy is accumulated in the coil 221. In the second period, the transistor Q2 is off. The magnetic energy accumulated in the coil 221 is output to the load 225 in the form of a current. This current is supplied to the load 225 through the diode 224.

Similar to FIG. 22, the bidirectional thyristor 61 prevents noise propagation. In addition, the function of the bidirectional thyristor 61 as an electrostatic protection circuit is as described with reference to FIG. 6 and the like.

Note that, regarding a synchronous rectification type or an asynchronous rectification type switching regulator, a step-up/down type switching regulator, which is switchable between a step-down type and a step-up type, may also be configured. In the switching regulators, for example, the bidirectional thyristor 61 may be provided between the first low-potential-side power source terminal TPG and the second low-potential-side power source terminal TVSS.

3. Solenoid Driver

Hereinafter, an example in which the circuit device of the present embodiment is applied to a solenoid driver will be described. The drive target is a solenoid.

Figure 26:
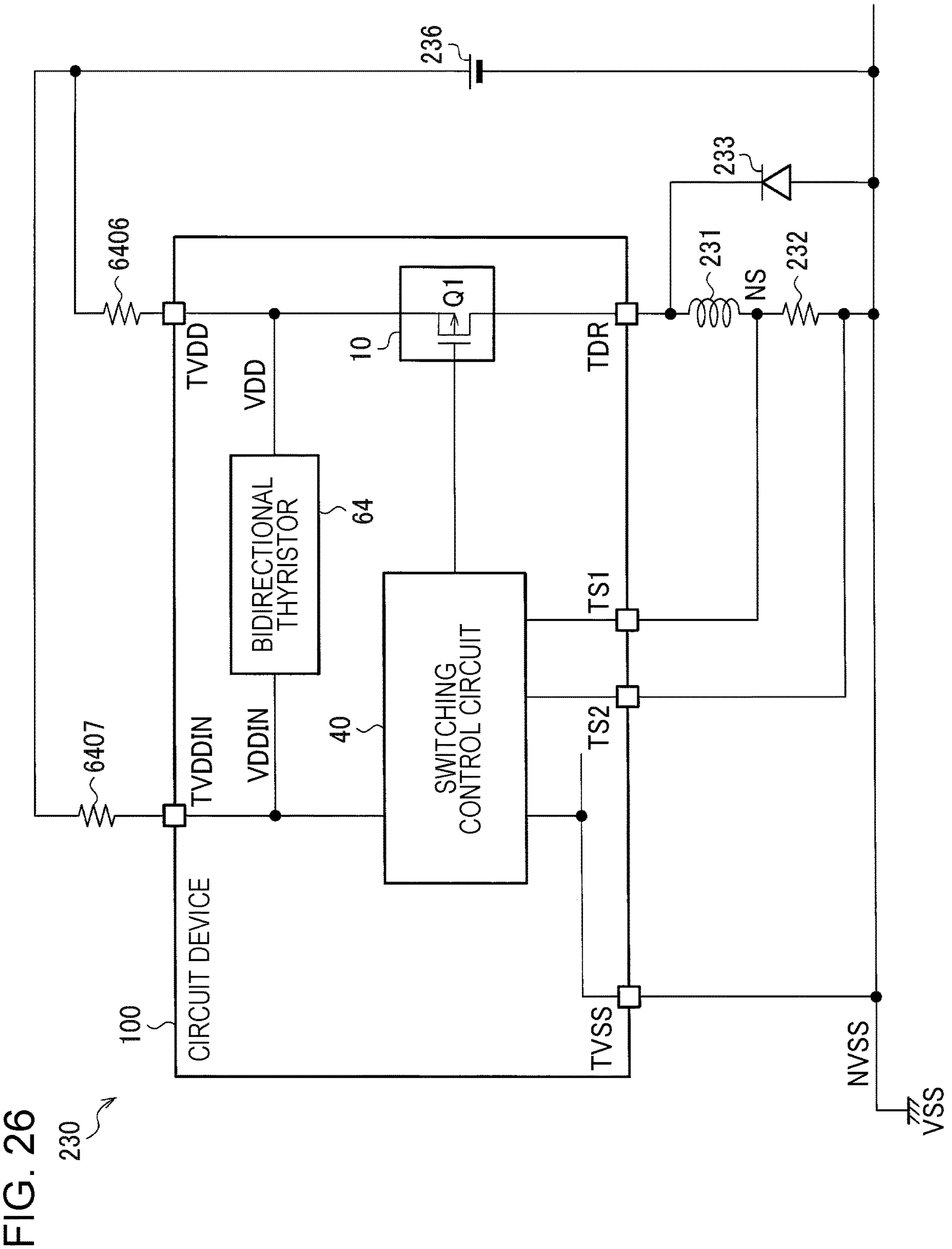
FIG. 26 shows a configuration example of a solenoid driver and a tenth configuration example of the circuit device.

FIG. 26 is a configuration example of a solenoid driver and a tenth configuration example of a circuit device. A solenoid driver 230 includes the circuit device 100, a solenoid 231, a sense resistor 232, and a diode 233. The circuit device 100 includes the switching control circuit 40, the drive circuit 10, a bidirectional thyristor 64, the first high-potential-side power source terminal TVDD, a second high-potential-side power source terminal TVDDIN, the drive terminal TDR, a sense terminal TS1, a sense terminal TS2, and the second low-potential-side power source terminal TVSS.

The first high-potential-side power source terminal TVDD and the second high-potential-side power source terminal TVDDIN are coupled to a positive electrode terminal of a power source 236. The second low-potential-side power source terminal TVSS is coupled to the ground node NVSS. The drive terminal TDR is coupled to one end of the solenoid 231. Another end of the solenoid 231 is coupled to a node NS. One end of the sense resistor 232 is coupled to the node NS, and another end of the sense resistor 232 is coupled to the ground node NVSS. The sense terminal TS1 is coupled to the node NS, and the sense terminal TS2 is coupled to the ground node NVSS. A cathode of the diode 233 is coupled to the drive terminal TDR, and an anode of the diode 233 is coupled to the ground node NVSS.

The drive circuit 10 includes the transistor Q1. The source of the transistor Q1 is coupled to the first high-potential-side power source terminal TVDD, and the power source voltage VDD is supplied thereto. The drain of the transistor Q1 is coupled to the drive terminal TDR.

The switching control circuit 40 outputs, to the gate of the transistor Q1, a pre-drive signal to control the transistor Q1 to be turned on or off based on voltages at both ends of the sense resistor 232. A period in which the transistor Q1 is on will be referred to as a first period, and a period in which the transistor Q1 is off will be referred to as a second period. A power source line of the switching control circuit 40 is coupled to the second high-potential-side power source terminal TVDDIN, and a power source voltage VDDIN is supplied thereto. The ground line of the switching control circuit 40 is coupled to the second low-potential-side power source terminal TVSS, and the ground voltage VSS is supplied thereto.

The bidirectional thyristor 64 is an electrostatic protection circuit between the first high-potential-side power source terminal TVDD and the second high-potential-side power source terminal TVDDIN. One end of the bidirectional thyristor 64 is coupled to the first high-potential-side power source terminal TVDD, and another end of the bidirectional thyristor 64 is coupled to the second high-potential-side power source terminal TVDDIN.

Note that a parasitic resistor 6406 is a parasitic resistor between the positive electrode terminal of the power source 236 and the source of the transistor Q1. A parasitic resistor 6407 is a parasitic resistor between the positive electrode terminal of the power source 236 and the power source node of the switching control circuit 40.

Figure 27:
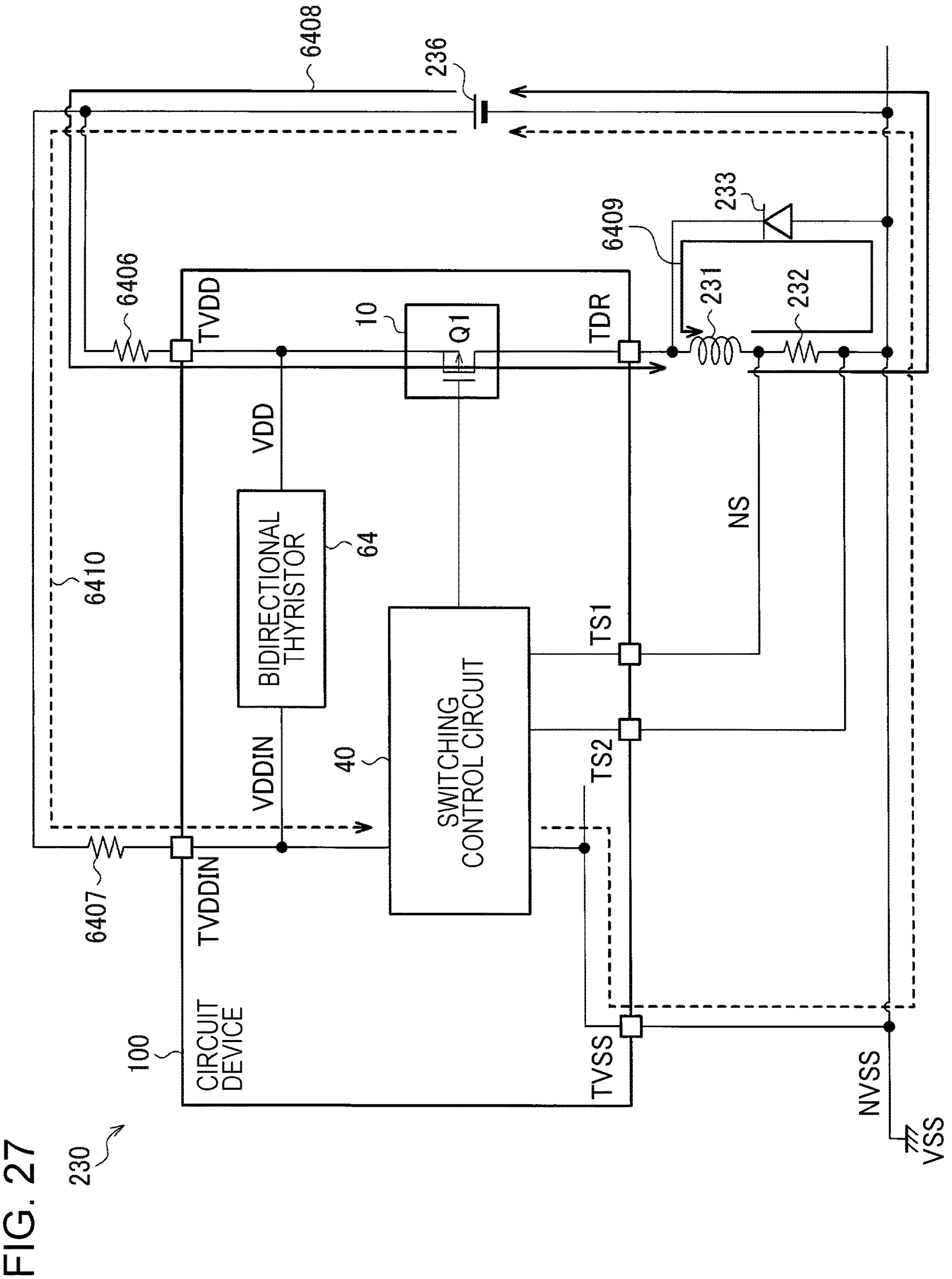
FIG. 27 shows current paths during the first period and the second period of the tenth configuration example.

In FIG. 27, current paths in the first period and the second period of the tenth configuration example are shown.

As represented by an arrow 6408, in the first period, a current flows from the positive electrode terminal of the power source 236 to the solenoid 231 and magnetic energy is accumulated in the solenoid 231. The switching control circuit 40 turns off the transistor Q1 when voltages at both ends of the sense resistor 232 reach a target voltage.

As represented by an arrow 6409, in the second period, the magnetic energy accumulated in the solenoid 231 is discharged in the form of a current. This current is regenerated through the diode 233. Thereafter, the switching control circuit 40 repeats the first period and the second period. Accordingly, control is performed such that a current flowing through the solenoid 231 becomes a constant current corresponding to the target voltage.

An arrow 6410 is a path through which an operating current of the switching control circuit 40 flows. This path extends through the parasitic resistor 6407 and does not pass through the parasitic resistor 6406. That is, the parasitic resistor 6406 is not a common impedance with respect to the path through which the operating current of the switching control circuit 40 flows. Accordingly, although noise of the power source voltage VDD of the drive circuit 10 is caused due to the influence of the parasitic resistor 6406, the power source voltage VDDIN of the switching control circuit 40 is not influenced by the noise.

As with the third bidirectional thyristor 63 in FIG. 14 and the like, the bidirectional thyristor 64 prevents propagation of noise from the power source voltage VDD to the power source voltage VDDIN. In addition, the effect of using the bidirectional thyristor 64 as the electrostatic protection circuit is as described with reference to FIG. 6 and the like.

In the present embodiment, the circuit device 100 includes the first high-potential-side power source terminal TVDD, the second high-potential-side power source terminal TVDDIN, the drive circuit 10, the switching control circuit 40, and the bidirectional thyristor 64. The drive circuit 10 is coupled to the first high-potential-side power source terminal TVDD and drives a drive target with a switching operation. The switching control circuit 40 is coupled to the second high-potential-side power source terminal TVDDIN and controls the switching operation of the drive circuit 10. One end of the bidirectional thyristor 64 is coupled to the first high-potential-side power source terminal TVDD, and another end of the bidirectional thyristor 64 is coupled to the second high-potential-side power source terminal TVDDIN.

The switching operation of the drive circuit 10 causes noise of the voltage VDD at the first high-potential-side power source terminal TVDD coupled to the drive circuit 10. According to the present embodiment, the switching control circuit 40 is coupled to the second high-potential-side power source terminal TVDDIN. Accordingly, the power source node of the switching control circuit 40 is separated from the noise of the voltage VDD of the first high-potential-side power source terminal TVDD. In addition, since the bidirectional thyristor 64 is provided between the first high-potential-side power source terminal TVDD and the second high-potential-side power source terminal TVDDIN, the internal circuit can be protected from static electricity. There is a possibility that the noise of the voltage VDD at the first high-potential-side power source terminal TVDD propagates to the power source node of the switching control circuit 40 via the bidirectional thyristor 64. However, since the trigger voltage of the bidirectional thyristor 64 is higher than the clamping voltage of the bidirectional thyristor 64, propagation of the noise can be prevented. Since the clamping voltage is lower than the trigger voltage, it is possible to secure a high level of electrostatic resistance while preventing noise propagation.

Although the present embodiment is described in detail as described above, those skilled in the art can easily understand that many modifications that do not substantially deviate from new matters and effects of the present disclosure are possible. Therefore, all such modification examples fall within the scope of the present disclosure. For example, in a specification or drawing, a term described at least once with a different term having a broader meaning or a synonym may be replaced with the different term in any part of the specification or the drawing. In addition, all combinations of the present embodiment and modification examples are also included in the scope of the present disclosure. In addition, the configuration, operation, and the like of the detection circuit, the control circuit, the pre-driver, the switching control circuit, the drive circuit, the bidirectional thyristor, the circuit device, the motor driver, the switching regulator, the solenoid driver, and the like are not limited to those described in the present embodiment, and various modifications can be made.

What is claimed is:

1. A circuit device comprising:

a first low-potential-side power source terminal;

a second low-potential-side power source terminal;

a drive circuit that is coupled to the first low-potential-side power source terminal and that drives a drive target with a switching operation;

a switching control circuit that is coupled to the second low-potential-side power source terminal and that controls the switching operation of the drive circuit; and a bidirectional thyristor for electrostatic protection of which one end is coupled to the first low-potential-side power source terminal and of which another end is coupled to the second low-potential-side power source terminal, wherein the switching control circuit includes:

a detection circuit configured to detect a current flowing through the drive target; and a control circuit configured to control the switching operation based on a result of detection performed by the detection circuit.

2. The circuit device according to claim 1, wherein the detection circuit includes a comparison circuit comparing a reference voltage with a voltage at the first low-potential-side power source terminal.

3. The circuit device according to claim 1, wherein the drive circuit includes a transistor driving the drive target, the control circuit outputs, based on the result of the detection performed by the detection circuit, a control signal to control the switching operation of the transistor, and the switching control circuit includes a pre-driver driving a gate of the transistor based on the control signal.

4. The circuit device according to claim 1, further comprising:

a third low-potential-side power source terminal; and a second bidirectional thyristor for electrostatic protection of which one end is coupled to the third low-potential-side power source terminal and of which another end is coupled to the second low-potential-side power source terminal, wherein the detection circuit includes a comparison circuit comparing a reference voltage with a voltage at the third low-potential-side power source terminal.

5. The circuit device according to claim 1, further comprising:

a first high-potential-side power source terminal;

a second high-potential-side power source terminal; and a third bidirectional thyristor of which one end is coupled to the first high-potential-side power source terminal and of which another end is coupled to the second high-potential-side power source terminal, wherein the drive circuit is coupled to the first high-potential-side power source terminal, and the switching control circuit is coupled to the second high-potential-side power source terminal.

6. The circuit device according to claim 1, wherein the bidirectional thyristor includes a first anode region which is an impurity region that is provided at a first well having a first conductivity type, that is electrically coupled to an anode line, and that has a second conductivity type, a first cathode region which is an impurity region that is provided at a second well having the second conductivity type, that is electrically coupled to a first cathode line coupled to the first low-potential-side power source terminal, and that has the first conductivity type, a first gate region which is an impurity region that is provided at the second well, that is electrically coupled to the first cathode line via a first resistor element, and that has the second conductivity type, a first impurity region that is provided at the second well, that is electrically coupled to the anode line via a second resistor element, and that has the first conductivity type, a second anode region which is an impurity region that is provided at the first well having the first conductivity type, that is electrically coupled to the anode line, and that has the second conductivity type, a second cathode region which is an impurity region that is provided at a third well having the second conductivity type, that is electrically coupled to a second cathode line coupled to the second low-potential-side power source terminal, and that has the first conductivity type, a second impurity region that is provided at the third well, that is electrically coupled to the anode line via the second resistor element, and that has the first conductivity type, a third gate region which is an impurity region that is provided at the first well, that is electrically coupled to the anode line via the second resistor element, and that has the first conductivity type, and a second gate region which is an impurity region that is provided at the third well, that is electrically coupled to the second cathode line via a third resistor element, and that has the second conductivity type.

7. A circuit device comprising:

a first high-potential-side power source terminal;

a second high-potential-side power source terminal;

a drive circuit that is coupled to the first high-potential-side power source terminal and that drives a drive target with a switching operation;

a switching control circuit that is coupled to the second high-potential-side power source terminal and that controls the switching operation of the drive circuit; and a bidirectional thyristor of which one end is coupled to the first high-potential-side power source terminal and of which another end is coupled to the second high-potential-side power source terminal, wherein the switching control circuit includes:

a detection circuit configured to detect a current flowing through the drive target; and a control circuit configured to control the switching operation based on a result of detection performed by the detection circuit.

8. The circuit device according to claim 1, wherein the drive target is a motor, a coil, or a solenoid.

9. The circuit device according to claim 7, wherein the drive target is a motor, a coil, or a solenoid.

10. A circuit device comprising:

a first low-potential-side power source terminal;

a second low-potential-side power source terminal;

a drive circuit that is coupled to the first low-potential-side power source terminal and that drives a drive target with a switching operation;

a switching control circuit that is coupled to the second low-potential-side power source terminal and that controls the switching operation of the drive circuit; and a bidirectional thyristor for electrostatic protection of which one end is coupled to the first low-potential-side power source terminal and of which another end is coupled to the second low-potential-side power source terminal, wherein the drive target is a motor, a coil, or a solenoid.

11. The circuit device according to claim 1, further comprising:

first and second drive terminals configured to be connected to the external drive target that is located at an outside of the circuit device, wherein the drive circuit is coupled to the first and second drive terminals, and the drive circuit is configured to drive the external drive target with the switching operation via the first and second drive terminals.

12. The circuit device according to claim 7, further comprising:

first and second drive terminals configured to be connected to the external drive target that is located at an outside of the circuit device, wherein the drive circuit is coupled to the first and second drive terminals, and the drive circuit is configured to drive the external drive target with the switching operation via the first and second drive terminals.

* * * * *